(12) United States Patent
Mizuno et al.

(10) Patent No.: US 7,112,999 B2
(45) Date of Patent: *Sep. 26, 2006

(54) SEMICONDUCTOR INTEGRATED CIRCUIT DEVICE

(75) Inventors: Hiroyuki Mizuno, Kokubunji (JP);
Masataka Minami, Hachioji (JP);
Koichiro Ishibashi, Warabi (JP);
Masayuki Miyazaki, Kokubunji (JP)

(73) Assignee: Renesas Technology Corporation, Tokyo (JP)

( * ) Notice: Subject to any disclaimer, the term of this patent is extended or adjusted under 35 U.S.C. 154(b) by 0 days.
This patent is subject to a terminal disclaimer.

(21) Appl. No.: 11/124,060

(22) Filed: May 9, 2005

(65) Prior Publication Data
US 2005/0195041 A1    Sep. 8, 2005

Related U.S. Application Data

(60) Continuation of application No. 10/154,956, filed on May 28, 2002, now Pat. No. 6,906,551, which is a continuation of application No. 09/696,283, filed on Oct. 26, 2000, now Pat. No. 6,404,232, which is a division of application No. 08/979,947, filed on Nov. 26, 1997, now Pat. No. 6,140,686.

(30) Foreign Application Priority Data

Nov. 26, 1996  (JP)  .................................. 8-314506
Dec. 27, 1996  (JP)  .................................. 8-349427

(51) Int. Cl.
*H03K 3/01*  (2006.01)
(52) U.S. Cl. ........................ 326/81; 326/83; 327/534
(58) Field of Classification Search ................. 326/81; 327/534
See application file for complete search history.

(56) References Cited

U.S. PATENT DOCUMENTS 5,352,939 A    10/1994  Hirabayashi et al.

(Continued)

FOREIGN PATENT DOCUMENTS

EP        742507        11/1996

OTHER PUBLICATIONS

English Translation of Japanese Office Action dated Feb. 24, 2004.
Fujii et al, A 45 ns 16Mb DRAM with Triple-Well Structure, ISSCC 89/Friday, Feb. 17, 1989, 1989 IEEE Int'l Solid-State Circuits Conference.

(Continued)

*Primary Examiner*—Vibol Tan
(74) *Attorney, Agent, or Firm*—Antonelli, Terry, Stout and Kraus, LLP.

(57) ABSTRACT

A semiconductor integrated circuit device comprising a logical circuit including a MIS transistor formed on a semiconductor substrate, a control circuit for controlling a threshold voltage of the MIS transistor forming the logical circuit, an oscillation circuit including a MIS transistor formed on the semiconductor substrate, the oscillation circuit being constructed so that the frequency of an oscillation output thereof can be made variable, and a buffer circuit, in which the control circuit is supplied with a clock signal having a predetermined frequency and the oscillation output of the oscillation circuit so that the control circuit compares the frequency of the oscillation output and the frequency of the clock signal to output a first control signal, the oscillation circuit is controlled by the first control signal so that the frequency of the oscillation output corresponds to the frequency of the clock signal, the control of the frequency of the oscillation output being performed in such a manner that the first control signal controls a threshold voltage of the MIS transistor forming the oscillation circuit, and the buffer circuit is constructed so that it is inputted with the first control signal to output a second control signal corresponding to the first control signal, the second control signal controlling the threshold voltage of the MIS transistor forming the logical circuit.

15 Claims, 20 Drawing Sheets

U.S. PATENT DOCUMENTS

| | | | |
|---|---|---|---|
| 5,420,528 A | 5/1995 | Shigehara | |
| 5,612,643 A | 3/1997 | Hirayama | |
| 5,672,995 A | 9/1997 | Hirase et al. | |
| 5,694,072 A | 12/1997 | Hsiao et al. | |
| 5,773,855 A | 6/1998 | Colwell et al. | |
| 5,796,129 A | 8/1998 | Mizuno | |
| 5,894,142 A | 4/1999 | Fiduccia et al. | |
| 5,920,089 A | 7/1999 | Kanazawa et al. | |
| 6,046,627 A | 4/2000 | Itoh et al. | |
| 6,140,686 A | 10/2000 | Mizuno et al. | |
| 6,166,577 A * | 12/2000 | Mizuno et al. | 327/278 |
| 6,191,615 B1 | 2/2001 | Koga | |
| 6,404,232 B1 | 6/2002 | Mizuno et al. | |
| 6,489,833 B1 | 12/2002 | Miyazaki et al. | |
| 6,774,706 B1 * | 8/2004 | Miyazaki et al. | 327/534 |

FOREIGN PATENT DOCUMENTS

| | | |
|---|---|---|
| JP | 61-214448 | 9/1986 |
| JP | 3167795 | 7/1991 |
| JP | 5108194 | 4/1993 |
| JP | 5110427 | 4/1993 |
| JP | 5152935 | 6/1993 |
| JP | 7066631 | 3/1995 |
| JP | 8-274620 | 10/1996 |
| JP | 8-314506 | 11/1996 |
| JP | 9036246 | 2/1997 |
| JP | 188982 | 6/2004 |

OTHER PUBLICATIONS

Chen et al, "A High Speed SOI Technology with 12ps/18ps Gate Delay Operating at 5V/1.5V", 1992 IEEE, pp. 2.5.1-2.5.4, no month.

Soden et al, Identifying Defects in Deep-Submicron CMOS Ics, *The Practical Engineer*, Sep. 1996, pp. 66-71.

Translation of Final Decision of Rejection, Issue No. 188982, Issue Date Jun. 1, 2004; Patent Application No. Hei 8-349427.

* cited by examiner

| | GATE ELECTRODE | | SOURCE/DRAIN OF NMOS |
| --- | --- | --- | --- |
| | FIRST WIRING LAYER | | SOURCE/DRAIN OF PMOS |
| | SECOND WIRING LAYER | | SURFACE HIGH-CONCENTRATION N LAYER FOR POWER SUPPLY TO SUBSTRATE OF PMOS |
| | NWELL | | SURFACE HIGH-CONCENTRATION P LAYER FOR POWER SUPPLY TO SUBSTRATE OF NMOS |
| ⊠ | CONT1 | ■ | CONT2 |

SEMICONDUCTOR INTEGRATED CIRCUIT DEVICE

This is a continuation of U.S. application Ser. No. 10/154,956, filed May 28, 2002 is now a U.S. Pat. No. 6,906,551, which is a continuation of U.S. application Ser. No. 09/696,283, filed Oct. 26, 2000 (now U.S. Pat. No. 6,404,232), which, in turn, is a divisional of U.S. application Ser. No. 08/979,947, filed Nov. 26, 1997 (now U.S. Pat. No. 6,140,686), the entire disclosures of all of which are hereby incorporated by reference.

BACKGROUND AND SUMMARY OF THE INVENTION

The present invention relates to a semiconductor device, and more particularly to a semiconductor device provided with both a high speed and a low power consumption.

FIG. 2 shows the prior art disclosed by JP-A-8-274620. (Hereinafter, this prior art will be denoted by the prior art A.) An oscillation circuit OSC0 is constructed such that an oscillation frequency thereof changes in accordance with the value of a control signal received at a terminal B1 from a control circuit CNT0. The control circuit CNT0 is constructed such that it receives a reference clock signal CLK0 from the exterior and receives an oscillation output of the oscillation circuit OSC0. A closed circuit system composed of the frequency-variable oscillation circuit OSC0 and the control circuit CNT0 inputted with an output S0 of the frequency-variable oscillation circuit OSC0 is constructed to form a stable system in which each circuit is applied with a negative feedback. With this closed circuit system, the oscillation frequency of the output S0 of the frequency-variable oscillation circuit OSC0 assumes a frequency corresponding to the frequency of the reference clock signal CLK0. For example, the oscillation frequency of the output S0 is synchronous with or the same as the frequency of the external clock signal.

The oscillation circuit OSC0 is composed of an N-type MOSFET (NMOSFET) and a P-type MOSFET (PMOSFET) formed on a semiconductor substrate and a control voltage from the control circuit CNT0 changes the substrate bias of the MOSFET. With this construction, the threshold value of the MOSFET changes in accordance with the change in substrate bias so that the oscillation frequency of the oscillation circuit OSC0 changes.

Further, it is constructed that a main circuit LOG0 receives a control signal from the control circuit CNT0 at a terminal B0 and the control signal controls the substrate biases of MOSFET's forming the main circuit LOG0, thereby controlling the threshold voltage of the MOSFET.

With such a construction, it becomes possible to control the threshold voltage of the MOSFET in the main circuit LOG0 by the reference clock signal CLK0 so that the threshold voltage of the MOSFET forming the main circuit LOG0 and hence a power consumption and an operating speed are made variable in accordance with the frequency of the reference clock signal (or in accordance with an operating frequency).

In the prior art A, no limitation is imposed as to a method for distribution of the signal B0 to the MOSFET's in the main circuit LOG0. However, the method for distribution of the substrate bias to the main circuit has a large relation with the power consumption and the packaging density of the main circuit.

In the prior art A, the main circuit LOG0 is controlled by a signal at B0 corresponding to a signal at the terminal B1. This correspondence has a large relation with the stability of the substrate bias control circuit and the stability of the substrate bias voltage.

In order to solve the two problems mentioned above, (1) the main circuit LOG0 in the prior art A is divided into a plurality of substrate control blocks by use of PMOS substrate bias switches and NMOS substrate bias switches, thereby making it possible to control the substrate bias of each circuit block independently of the substrate bias control circuit.

(2) In the embodiment of the prior art A, the signal B0 inputted to the main circuit LOG0 is a signal corresponding to the signal B1 inputted to the frequency-variable oscillation circuit OSC0. In an embodiment of the present invention, a substrate bias corresponding to the signal B0 is particularly generated by use of a substrate bias buffer from a substrate bias corresponding to the signal B1. An input impedance of the substrate bias buffer is made high and an output impedance thereof is made lower than the input impedance.

Next, description will be made of a cell layout suitable for construction of a semiconductor device provided with both a high speed and a low power consumption. The present invention relates to a semiconductor device and a cell library or a semiconductor device using the cell library, and more particularly to a semiconductor device in which a substrate bias and a supply voltage can be controlled independently of each other.

The layout of the conventional CMOS inverter is shown in FIG. 13. Symbol MP1 denotes a P-type MOS transistor (hereinafter referred to as PMOS) composed of P-type diffused (or impurity) layers forming the source and drain of PMOS and a gate electrode, and symbol MN1 denotes an N-type MOS transistor (hereinafter referred to as NMOS) composed of N-type diffusion (or impurity) layers forming the source and drain of NMOS and a gate electrode. Numeral 110 denotes a second metal layer which is supplied with a positive supply voltage (hereinafter referred to as VDD). Numeral 111 denotes a second metal layer which is supplied with a negative supply voltage (hereinafter referred to as VSS).

The substrate or well potential of the PMOS MP1 (hereinafter referred to as PMOS substrate or well bias) is supplied from a surface high-concentration N layer (hereinafter referred to as PMOS substrate or well diffused (or impurity) layer) 204. The PMOS substrate or well bias is connected to the second metal layer through a first metal layer 110 so that it is supplied with VDD. The substrate or well potential of the NMOS MN1 is supplied from a surface high-concentration P layer (hereinafter referred to as NMOS substrate or well diffused (or impurity) layer) 203. The NMOS substrate or well bias is connected to the second metal layer 111 through the first metal layer so that it is supplied with VSS. Thus, in the prior art shown in FIG. 13, the PMOS substrate or well bias is connected to VDD and the NMOS substrate or well bias is connected to VSS.

There is conventionally known a method in which a substrate or well bias is set to a potential different from a supply voltage in order to control the threshold value of a MOS transistor. In the cell structure shown in FIG. 13, however, it is not possible to set the substrate or well bias to a potential different from the supply voltage.

FIG. 14 shows the layout of a CMOS inverter cell in the case where it is constructed such that the substrate or well bias of a PMOS and the substrate or well bias of an NMOS can be set to a potential other than VDD and a potential other than VSS, respectively. The substrate or well bias of the PMOS is supplied from a second metal layer 112, and the substrate or well bias of the NMOS is supplied from a second metal layer 113. Since the second metal layers 112 and 113 are electrically isolated from second metal layers 110 and 111, respectively, the substrate or well bias of the PMOS and the substrate or well bias of the NMOS can be supplied with independent potentials.

Circuit diagrams corresponding to FIGS. 13 and 14 are shown in FIGS. 15A and 15B, respectively.

In the case where it is constructed such that the substrate or well bias of the PMOS and the substrate or well bias of the NMOS can be set to a potential other than VDD and a potential other than VSS, respectively, the following is apparent from the comparison of FIGS. 13 and 14.

(1) In the case where the height of a cell 300 is made the same as the height of a cell 200, the width of each of the power supply metal layers 110 and 111 becomes narrow. Thereby, a power supplying capability is deteriorated. (Hereinafter, this will be referred to as a first problem.)

(2) In the case where the power supply metal layers 110 and 111 of the cell 200 are made the same in width as the power supply metal layers 110 and 111 of the cell 200, the height of the cell 300 becomes higher than the height of the cell 200 because there is a wiring area for the second metal layers 112 and 113. Thereby, the area is increased. (Hereinafter, this will be referred to as a second problem.)

(3) In the case where a metal layer other than the second metal layer is used for the substrate or well bias supply lines 112 and 113, a restriction is imposed on a wiring in a cell and a wiring between cells. Thereby, the area is increased. (Hereinafter, this will be referred to as a third problem.)

In order to solve the first to third problems simultaneously, the supply of the substrate or well bias is performed by the PMOS substrate or well diffused (or impurity) layer and the NMOS substrate or well diffused (or impurity) layer. Alternatively, the supply of the substrate or well bias is performed by metal layers other than metal layers used for in-cell and inter-cell power supply wirings or signal wirings.

A method for power supply to each cell is known by, for example, JP-A-61-214448. In this known example, a contact is provided to a contact region for doped well and a well voltage supply is performed by the contact. In the present invention, there is no need to provide a contact for well voltage supply and the well voltage supply is performed through an impurity layer of an adjoining cell.

An example of a semiconductor integrated circuit device provided by the present invention comprises a logical circuit including a MIS transistor formed on a semiconductor substrate, a control circuit for controlling a threshold voltage of the MIS transistor forming the logical circuit, an oscillation circuit including a MIS transistor formed on the semiconductor substrate, the oscillation circuit being constructed so that the frequency of an oscillation output thereof can be made variable, and a buffer circuit, in which the control circuit is supplied with a clock signal having a predetermined frequency and the oscillation output of the oscillation circuit so that the control circuit compares the frequency of the oscillation output and the frequency of the clock signal to output a first control signal, the oscillation circuit is controlled by the first control signal so that the frequency of the oscillation output corresponds to the frequency of the clock signal, the control of the frequency of the oscillation output being performed in such a manner that the first control signal controls a threshold voltage of the MIS transistor forming the oscillation circuit, and the buffer circuit is constructed so that it is inputted with the first control signal to output a second control signal corresponding to the first control signal, the second control signal controlling the threshold voltage of the MIS transistor forming the logical circuit.

Also, bias switch circuits may be provided corresponding to the circuit blocks, respectively. The oscillation circuit is controlled by the first control signal so that the frequency of the oscillation output corresponds to the frequency of the clock signal, the control of the frequency of the oscillation output being performed in such a manner that the first control signal controls a threshold voltage of the MIS transistor forming the oscillation circuit, a second control signal corresponding to the first signal is inputted to the plurality of bias switch circuits which in turn outputs a plurality of third control signals, and the third control signals are inputted to the circuit blocks corresponding to the bias switch circuits which output the third control signals, the third control signals controlling a threshold voltage of the MIS transistor forming the circuit block.

Two control circuits including first and second control circuits may be provided. The first control circuit generates a control signal A so that the timing of rise of the oscillation output and the timing of rise of the clock signal coincide with each other. The second control circuit generates a control signal B so that the timing of fall of the oscillation output and the timing of fall of the clock signal coincide with each other. The oscillation circuit is controlled by the control signal A and the control signal B so that the oscillation output assumes the same signal as the clock signal, the control of the frequency of the oscillation output being performed in such a manner that the control signal A and the control signal B control a threshold voltage of the MIS transistor forming the oscillation circuit. At this time, the threshold voltage of the MIS transistor forming said logical circuit is controlled by a second control signal corresponding to a first control signal which includes the control signal A and the control signal B.

A cell layout in the circuit block comprises a first cell having at least one MIS transistor and a second cell having at least one MIS transistor, in which the first cell and the second cell are arranged so that they adjoin each other, the first cell is provided with a first impurity layer for supply of a substrate or well potential of the MIS transistor, the second cell is provided with a second impurity layer for supply of a substrate or well potential of the MIS transistor, and the first impurity layer and the second impurity layer are at least partially contiguous to each other so that the supply is made to the first impurity layer through the second impurity layer.

The substrate or well potential is supplied with a potential independent of a supply voltage. For example, the substrate or well bias is set so that a threshold value of the at least one MIS transistor becomes low when the semiconductor device is operating (or at the time of active condition) and the threshold value of the at least one MIS transistor becomes high when the semiconductor device is not operating (or at the time of standby). Also, the substrate or well potential may be set so that a threshold value of the at least one MIS transistor becomes high at the time of selection of the semiconductor device. Also, a power supply wiring may cover the impurity layer.

That the impurity layer is converted into a silicide, is preferable since a resistance thereof is small. A capacitance may be connected between the impurity layer which supplies the substrate or well potential and a power supply line.

BRIEF DESCRIPTION OF THE DRAWINGS

FIG. 12 is arranged in a three-stage connection form.

FIG. 20A and FIG. 12 are connected.

DESCRIPTION OF THE PREFERRED EMBODIMENTS

Specific embodiments of the present invention will now be described in reference to the drawings.

Figure 1:
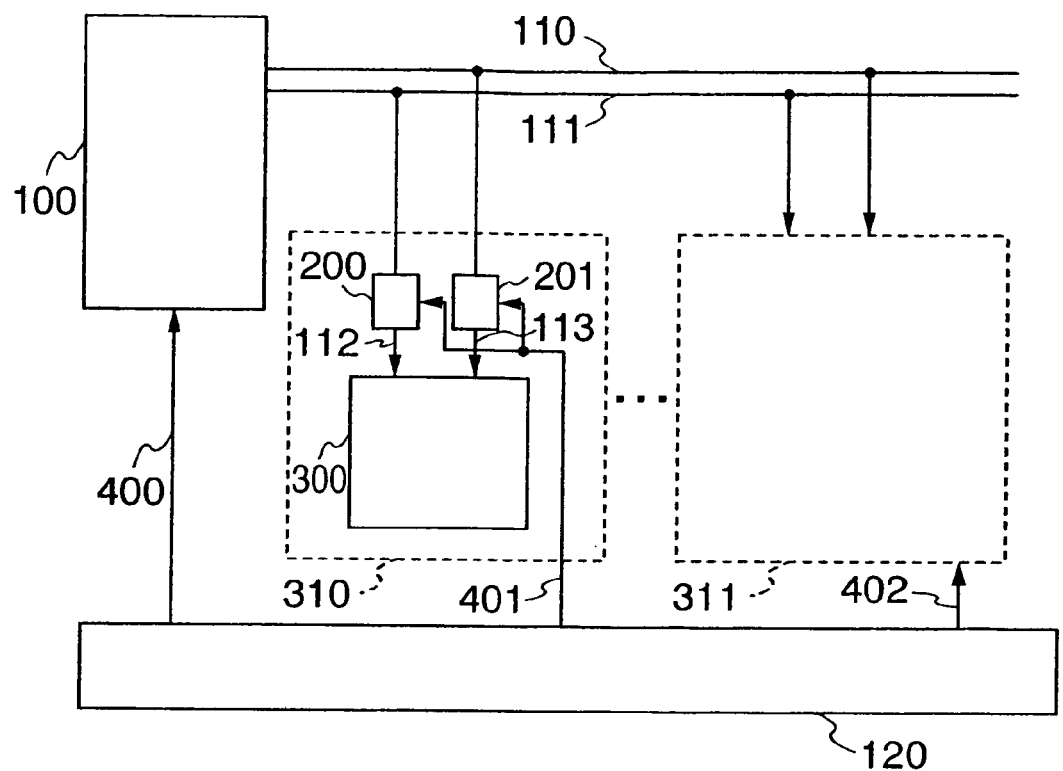
FIG. 1 is a block diagram of the most simple embodiment of the present invention.

FIG. 1 is a diagram showing an embodiment of a first invention in the present invention. Numeral 100 denotes a substrate bias control circuit which is similar to that used in the prior art A and is composed of a frequency-variable oscillation circuit OSC0 and a control circuit CNT0. Numerals 310 and 311 denote substrate control blocks each of which is composed of a circuit block 300 including a plurality of MOSFET's, a PMOS substrate bias switch circuit 200 and an NMOS substrate bias switch circuit 201. Numeral 120 denotes a power control circuit.

With the construction in the prior art A, a PMOS substrate bias 110 and an NMOS substrate bias 111 adapted for an operating frequency are outputted from the substrate bias control circuit 100 and are inputted to the circuit blocks 300 in the substrate control blocks 310 and 311 through the PMOS and NMOS substrate bias switches 200 and 201, respectively.

The inputted PMOS substrate bias 112 and NMOS substrate bias 113 are connected to the back gates of the MOSFET's in the circuit block 300. (The back gate herein referred to means a terminal which applies the substrate bias of the MOSFET. Accordingly, it is self-evident that there is also a possibility that the application actually results in the power supply to the N-type well or P-type well.)

The substrate bias control circuit 100 is controlled by a standby signal 400 from the power control circuit 120 and takes an operating condition when the standby signal 400 is "H" and a stopped condition when the standby signal 400 is "L".

A difference between the operating condition and the stopped condition lies in that the power consumption of the substrate bias control circuit 100 in the stopped condition is smaller than that in the operating condition. Excepting this difference, there is no special limitation. Also, it is of course that the standby signal 400 may not be required, for example, in the case where the substrate bias control circuit 100 has only the operating condition.

The PMOS substrate bias switch 200 and the NMOS substrate bias switch 201 are controlled by a standby signal 401 or 402 outputted from the power control circuit 120. When the standby signal 401 or 402 is "H", the PMOS substrate bias switch 200 and the NMOS substrate bias switch 201 transfer the potentials of the substrate biases 110 and 111 to the substrate biases 112 and 113 as they are. When the standby signal 401 or 402 is "L", the substrate biases 112 and 113 assume substrate bias potentials deeper than those when the standby signal is "H".

For example, provided that the power supply voltage is 1.0 V and the substrate biases 110 and 111 are 1.2 V and −0.2 V, respectively, the substrate biases 112 and 113 are respectively applied with 1.2 V and −0.2 V when the standby signal 401 or 402 is "H" and are respectively applied with 3.3 V and −2.3 V when the standby signal 401 or 402 is "L".

By dividing the main circuit LOG0 in the prior art A into the plurality of substrate control blocks 310 and 311 by use of the PMOS and NMOS substrate bias switches 200 and 201, as shown in FIG. 1, it is possible to control the substrate bias of each circuit block 300 independently of the substrate bias control circuit 100.

For example, when the circuit block 300 is operating, the standby signal 401 takes "H". Since the potentials of the substrate biases 110 and 111 are transferred to the substrate biases 112 and 113 as they are, the substrate bias of the MOSFET in the circuit block 300 is applied with a substrate bias adapted for an operating frequency.

Also, when the circuit block 300 is being stopped, the standby signal takes "L". Substrate biases deeper than those at the time of operation are respectively outputted to the substrate biases 112 and 113 so that the threshold voltage of the MOSFET in the circuit block 300 is increased, thereby making it possible to reduce a sub-threshold leakage current.

Further, a clock signal may be supplied to circuit block 300 only when each circuit block 300 is operating. (Regarding a method for realizing this, no special limitation is imposed.) Thereby, it is possible to reduce the power consumption of a circuit block when the circuit block is being stopped.

By dividing the main circuit in the prior art into a plurality of circuit blocks to make the individual control of the substrate bias, as mentioned above, it is possible to reduce a sub-threshold leakage current of a circuit block when the circuit block is being stopped, thereby reducing the effective power consumption of the whole of the main circuit.

Further, since the substrate bias of the circuit block 300 can be controlled by use of the PMOS substrate bias switch 200 and the NMOS substrate bias switch 201 independently of the substrate bias control circuit 100, it is possible to shorten a time necessary for the transfer of the circuit block 300 from the stopped condition to the operating condition or from the operating condition to the stopped condition. Though depending on the substrate driving capability of the substrate bias switch 200 or 201, the transfer becomes possible with a short time on the order of about several-hundred nanoseconds. Accordingly, even if the standby signal 401 or 402 is changed at a high frequency so that the operation condition of the circuit block is changed at the high frequency, the performance of the system is not deteriorated.

Figure 3:
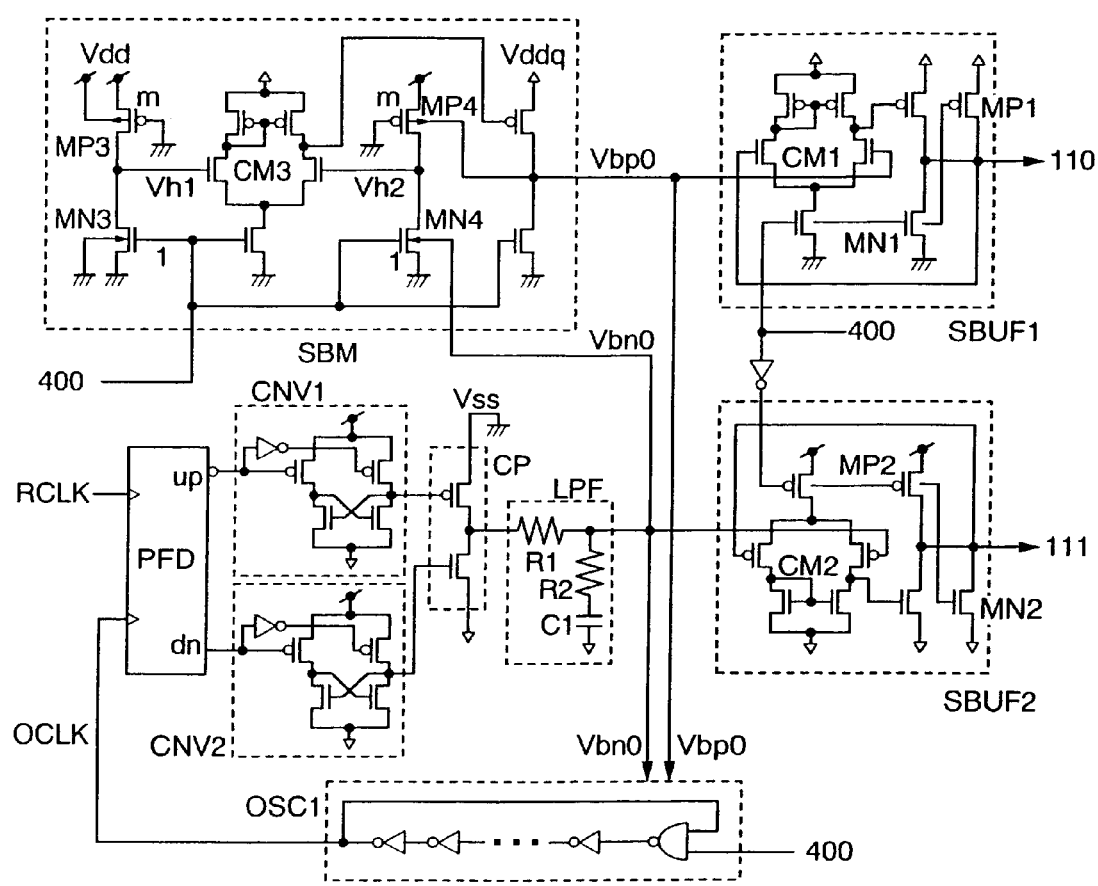
FIG. 3 is a circuit diagram of an embodiment of a substrate bias control circuit shown in FIG. 1.

FIG. 3 shows an embodiment of the substrate bias control circuit 100 shown in FIG. 1. An example of the substrate bias control circuit is also shown by the prior art A. The embodiment shown in FIG. 3 exhibits a basic operation similar to that of the example shown by the prior art A but has a circuit construction different from that of the example shown by the prior art A.

Symbol OSC1 denotes a frequency-variable oscillation circuit which is a ring oscillator composed of an inverter row and a two-input NAND circuit. Symbols PFD, CP and LPF denote a phase/frequency compare circuit, a charge pump circuit and a low-pass filter which are also disclosed by the prior art A. Symbol RCLK denotes a reference clock signal inputted to the frequency-variable oscillation circuit OSC1.

Symbols CNV1 and CNV2 each denote a voltage level converter by which a digital signal having a high level "H" of Vdd (or a positive supply voltage potential, for example, 1.0 V) and a low level "L" of Vss (or a negative supply voltage potential, for example, 0.0 V) is converted into a digital signal having a high level "H" of Vdd and a low level "L" of Vssq (or a second negative supply voltage potential, for example, −2.3 V).

Symbols MP1 to MP4 denote PMOSFET's, symbols MN1 to MN4 denote NMOSFET's, and symbols CM1 to CM3 denote differential amplifiers. Symbols SBUF1 and SBUF2 denote substrate bias buffers which, when 400 is "H", receive substrate biases Vbp0 and Vbn0 with a high impedance and output them to 110 and 111 with a low impedance and with a gain of 1.

When 400 is "L", Vddq (or a second positive supply voltage potential, for example, 3.3 V) and Vssq are respectively outputted to 110 and 111. At the same time, the currents of constant current sources in the differential amplifiers CM1 and CM2 are turned off. Thereby, the power consumption of each of the substrate bias buffers SBUF1 and SBUF2 becomes small.

Symbol SBM denotes a substrate bias mirror circuit which is inputted with the substrate bias Vbn0 and outputs the substrate bias Vbp0.

Figure 4:
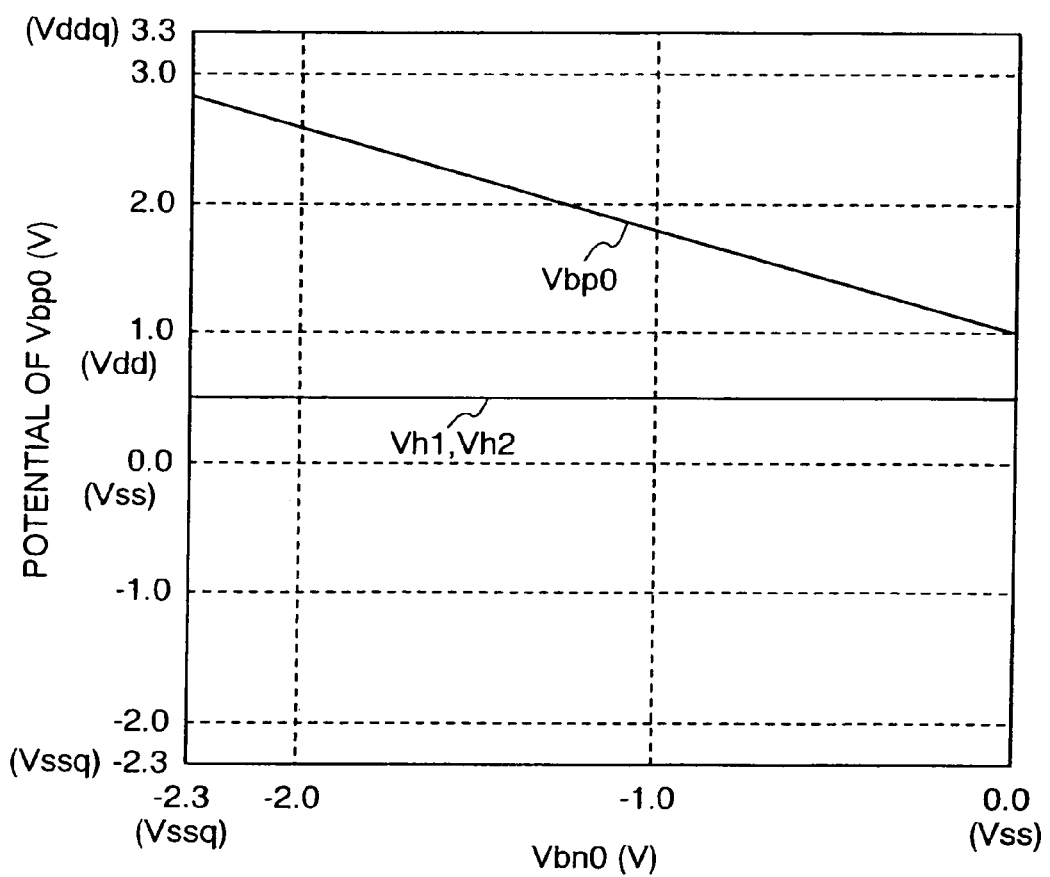
FIG. 4 is a graph representing the operation of a substrate bias mirror circuit shown in FIG. 1.

FIG. 4 is a diagram showing the substrate bias Vbp0 output of the substrate bias mirror circuit SBM. The detailed operation of SBM will be described in conjunction with FIG. 9.

The reference clock signal RCLK and an output OCLK of the frequency-variable oscillation circuit OSC1 are inputted to the phase/frequency compare circuit PFD which in turn outputs an UP signal and a DN signal in accordance with a difference in phase or frequency between both the input signals. The UP and DN signals are inputted to the charge pump CP through the voltage level converters CNV1 and CNV2, respectively, so that a substrate bias Vbn0 is generated through the low-pass filter LPF. The substrate bias Vbn0 is inputted to the above-mentioned substrate bias mirror circuit SBM which in turn generates a substrate bias Vbp0. The generated substrate biases Vbp0 and Vbn0 are respectively connected to the back gates of the MOSFET's as the substrate biases of the PMOSFET's and NMOSFET's which form the frequency-variable oscillation circuit OSC1.

With this phase locked loop system, the oscillating frequency of the frequency-variable oscillation circuit OSC1 becomes the same as the frequency of the reference clock signal and it is therefore possible to control the substrate biases Vbp0 and Vbn0 by the reference clock signal.

Figure 2:
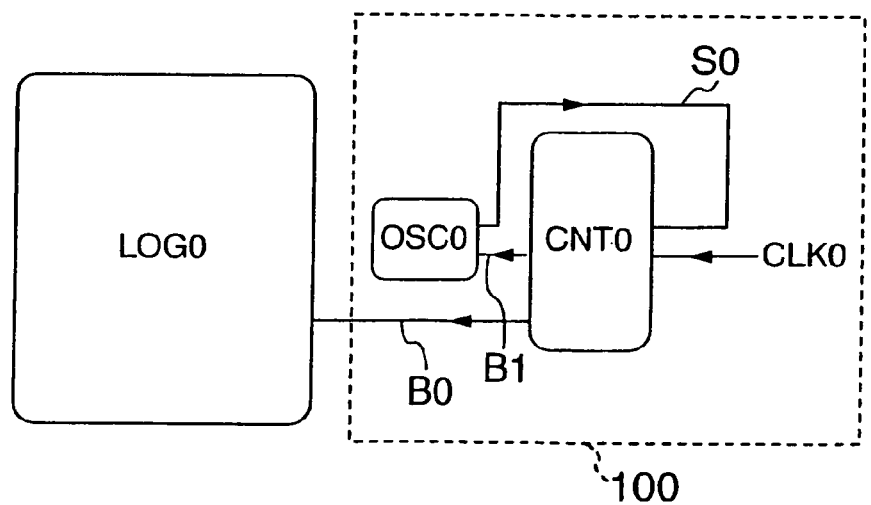
FIG. 2 is block diagram showing the prior art.

In the prior art A shown in FIG. 2, the signal B0 inputted to the main circuit LOG0 is a signal corresponding to the signal B1 inputted to the frequency-variable oscillation circuit OSC0. In the embodiment shown in FIG. 3, the substrate biases 110 and 111 corresponding to the signal B0 are particularly generated from the substrate biases Vbp0 and Vbn0 corresponding to the signal B1 by use of the substrate bias buffers SBUF1 and SBUF2.

Thereby, even if large load are connected to the substrate biases 110 and 111, no influence is exerted on the substrate biases Vbp0 and Vbn0. Accordingly, the design of the above-mentioned phase locked loop system is facilitated and a time until the phase locked loop system becomes stable (or a lock time) can be shortened.

The structure of the substrate bias buffer SBUF1 or SBUF2 is not limited to that shown in FIG. 3, so far as it is possible to receive the substrate biases Vbp0 and Vbn0 with a high impedance and to output them to 110 and 111 with a low impedance.

Figure 5:
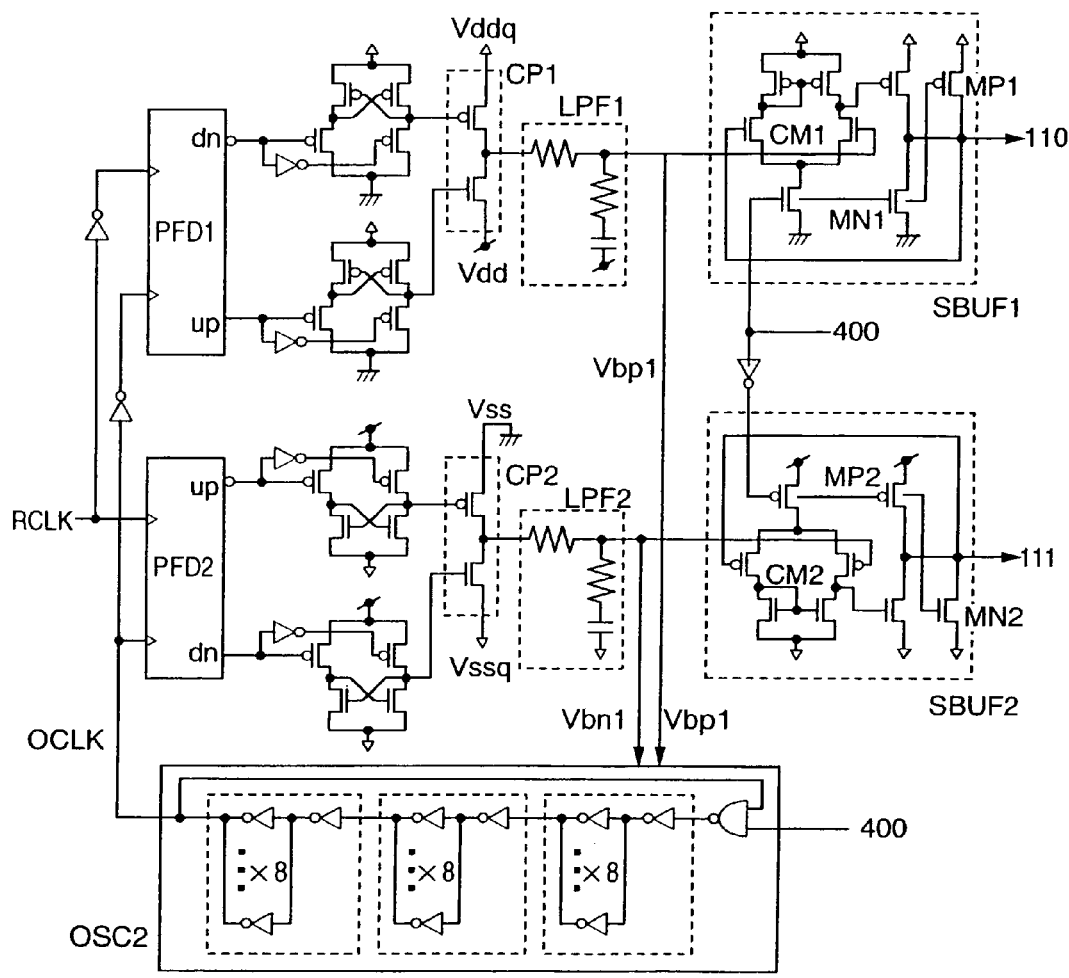
FIG. 5 is a circuit diagram of another embodiment of the substrate bias control circuit shown in FIG. 1.
Figure 5:
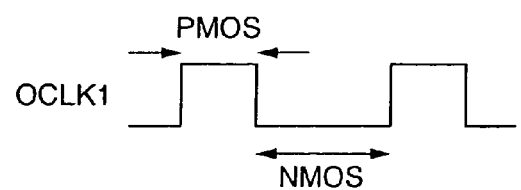

FIG. 5 shows another embodiment of the substrate bias control circuit 100 of FIG. 1 which is different from the embodiment shown in FIG. 3.

Symbol OSC2 denotes a frequency-variable oscillation circuit which includes a ring oscillator composed of an inverter row and a two-input NAND circuit. Symbols PFD1 and PFD2 denote phase/frequency compare circuits, numerals CP1 and CP2 charge pump circuits, and symbols LPF1 and LPF2 low-pass filters. Symbol RCLK denotes a reference clock signal having a duty ratio (or the rate of an "H" interval in one period of the clock signal) of 50%. Symbols SBUF1 and SBUF2 denote substrate bias buffers shown in FIG. 3.

By virtue of a phase locked loop system composed of the frequency-variable oscillation circuit OSC2, the phase/frequency compare circuit PFD1, the charge pump circuit CP1 and the low-pass filter LPF1, a substrate bias Vbp1 changes so that the timing of fall of an oscillation output OCLK1 of the frequency-variable oscillation circuit OSC2 and the timing of fall of the reference clock signal RCLK become the same.

Similarly, by virtue of a phase locked loop system composed of the frequency-variable oscillation circuit OSC2, the phase/frequency compare circuit PFD2, the charge pump circuit CP2 and the low-pass filter LPF2, a substrate bias Vbn1 changes so that the timing of rise of the oscillation output OCLK1 of the frequency-variable oscillation circuit OSC2 and the timing of rise of the reference clock signal RCLK become the same.

Ultimately, by the two phase locked loop systems mentioned above, the substrate biases Vbp1 and Vbn1 change so that the timings of rise and fall of the oscillation output OCLK1 of the frequency-variable oscillation circuit OSC2 become the same as the timings of rise and fall of the reference clock signal RCLK. In other words, the substrate biases Vbp1 and Vbn1 change so that the phase, frequency and duty ratio of the oscillation output OCLK1 of the frequency-variable oscillation circuit OSC2 become the same as the phase, frequency and duty ratio (50%) of the reference clock signal RCLK.

The substrate biases Vbp1 and Vbn1 should not be determined independently of each other. For example, it is necessary that the drain currents (or driving capabilities) of the PMOSFET and NMOSFET having their back gates applied with those substrate biases Vbp1 and Vbn1 hold a proper ratio such as 2:1 therebetween.

The "H" interval of the oscillation output OCLK1 of the frequency-variable oscillation circuit OSC2 is mainly determined by that driving capability of the PMOSFET in the frequency-variable oscillation circuit OSC2 (which depends on the threshold value of the PMOSFET, that is, the substrate bias Vbn1 applied to the PMOSFET) while the "L" interval thereof is mainly determined by that driving capability of the NMOSFET in the frequency-variable oscillation circuit OSC2 (which depends on the threshold value of the NMOSFET, that is, the substrate bias Vbp1 applied to the NMOSFET). Accordingly, that the duty ratio of the oscillation output OCLK1 of the frequency-variable oscillation circuit OSC2 comes to 50%, means that a ratio in driving capability between the PMOSFET and NMOSFET in the frequency-variable oscillation circuit OSC2 comes to a ratio in w (gate width) between the PMOSFET and NMOSFET or that a balance between the substrate biases Vbp1 and Vbn1 is held.

Thus, in the embodiment shown in FIG. 5, the values of the substrate biases Vbp1 and Vbn1 are determined by the frequency of the reference clock signal RCLK and the balance between the substrate biases Vbp1 and Vbn1 is determined by the ratio in w between the PMOSFET and NMOSFET in the frequency-variable oscillation circuit OSC2.

In FIG. 5, the substrate biases 110 and 111 corresponding to the signal B1 are generated from the substrate biases Vbp1 and Vbn1 by use of the substrate bias buffers SBUF1 and SBUF2 in a manner similar to that in the case of FIG. 3.

Thereby, even if large loads are connected to the substrate biases 110 and 111, no influence is exerted on the substrate biases Vbp1 and Vbn1 as in the case of FIG. 3. Accordingly, the design of the above-mentioned phase locked loop system is facilitated and a time until the phase locked loop system becomes stable (or a lock time) can be shortened.

It is of course that as in the case of FIG. 3, the structure of the substrate bias buffer SBUF1 or SBUF2 is not limited to that shown in FIG. 5, so far as it is possible to receive the substrate biases Vbp1 and Vbn1 with a high impedance and to output them to 110 and 111 with a low impedance.

Figure 6A:
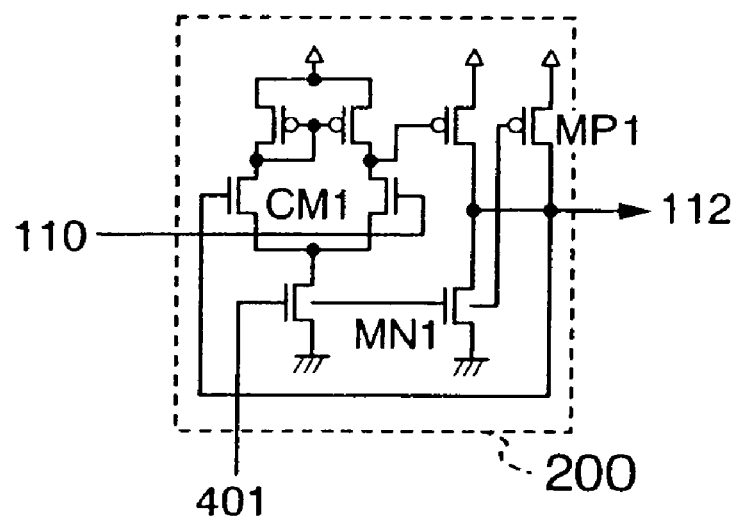
FIG. 6A is a circuit diagram of an embodiment of a PMOS substrate bias switch.
Figure 6B:
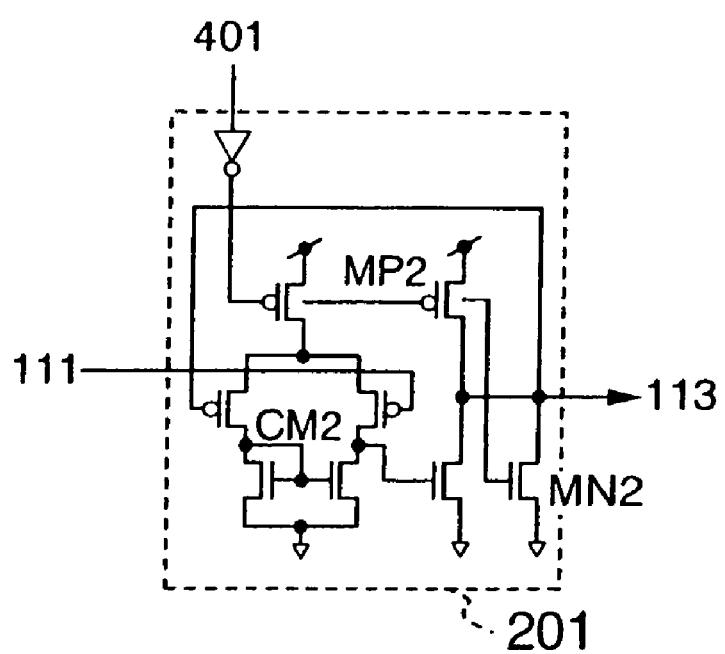
FIG. 6B is a circuit diagram of an embodiment of an NMOS substrate bias switch.

FIGS. 6A and 6B show embodiments of the substrate bias switches 200 and 201 shown in FIG. 1, respectively. They can be realized by the similar to the substrate bias buffers SBUF1 and SBUF2 shown in FIG. 3 or 5.

When 401 is "H", receive substrate biases 110 and 111 with a high impedance and output them to 112 and 113 with a low impedance and with a gain of 1.

When 400 is "L", Vddq and Vssq are respectively outputted to 112 and 113. At the same time, the currents of constant current sources in differential amplifiers CM1 and CM2 are turned off. Thereby, the power consumption of each of the substrate bias switches 200 and 201 becomes small.

Figure 7:
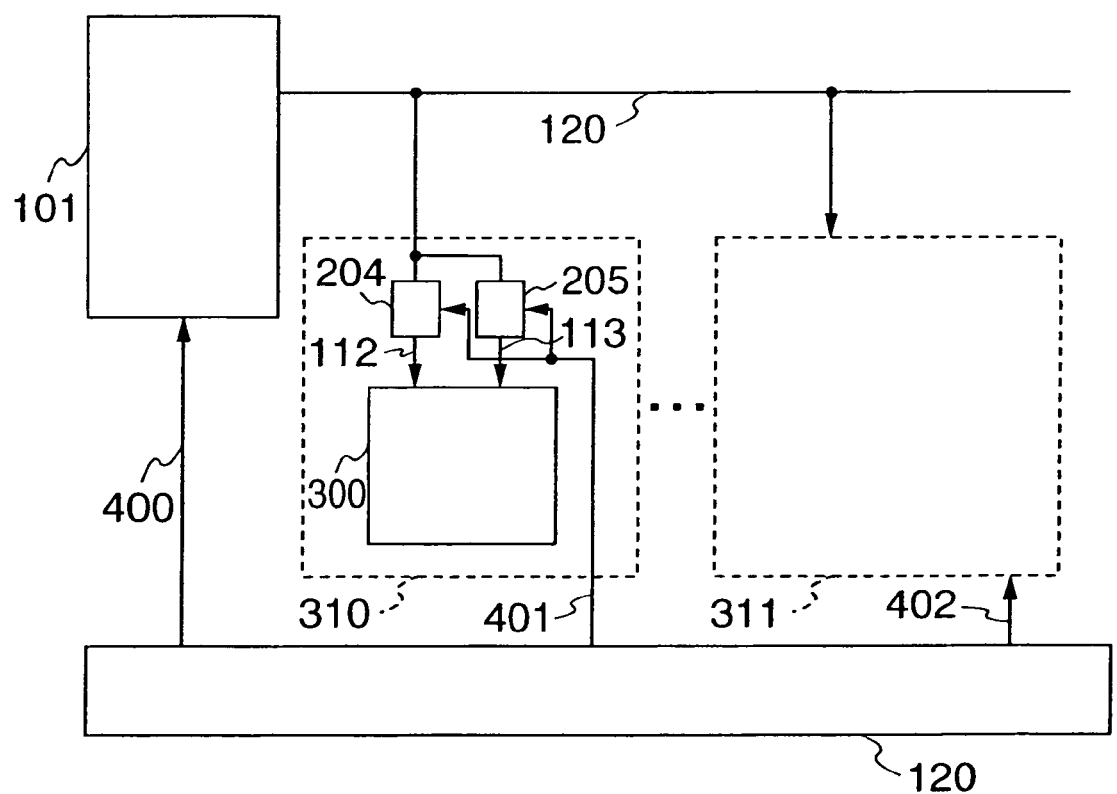
FIG. 7 is a block diagram of another embodiment of the present invention.

FIG. 7 shows another embodiment of the present invention. In FIG. 1, the PMOS substrate bias 110 and the NMOS substrate bias adapted for the operating frequency are outputted from the substrate bias control circuit 100. In FIG. 3, on the other hand, only a bias 120 is outputted. When a power control signal 401 or 402 is "H", a PMOS substrate bias 112 and an NMOS substrate bias 113 are outputted from the bias 120 by a PMOS substrate bias switch 204 and an NMOS substrate bias switch 205. The PMOS substrate bias 112 and the NMOS substrate bias 113 are inputted to the back gates of MOSFET's in a circuit block 300.

The bias 120 may be either the PMOS substrate bias 110 or the NMOS substrate bias 111 shown in FIG. 1. For example, if the bias 120 is the same signal as the PMOS substrate bias 110 shown in FIG. 1, the substrate bias switch 204 may be identical to the substrate bias switch 200 shown in FIG. 1. Also, the substrate bias switch 205 is enough so far as it can generate the correspondence to the NMOS substrate bias 111 from the bias 120 (identical to the PMOS substrate bias 110 in this case) when the power control signal 401 or 402 is "H".

An effect quite similar to that in the case of FIG. 1 can be obtained. Further, the embodiment shown in FIG. 7 has a merit that the efficiency of wiring is improved because the substrate bias can be supplied to substrate control blocks 310 and 310 by use of one wiring or only the bias 120 in contrast with the case of FIG. 1 where two wirings including the substrate biases 110 and 111 are necessary.

Figure 8:
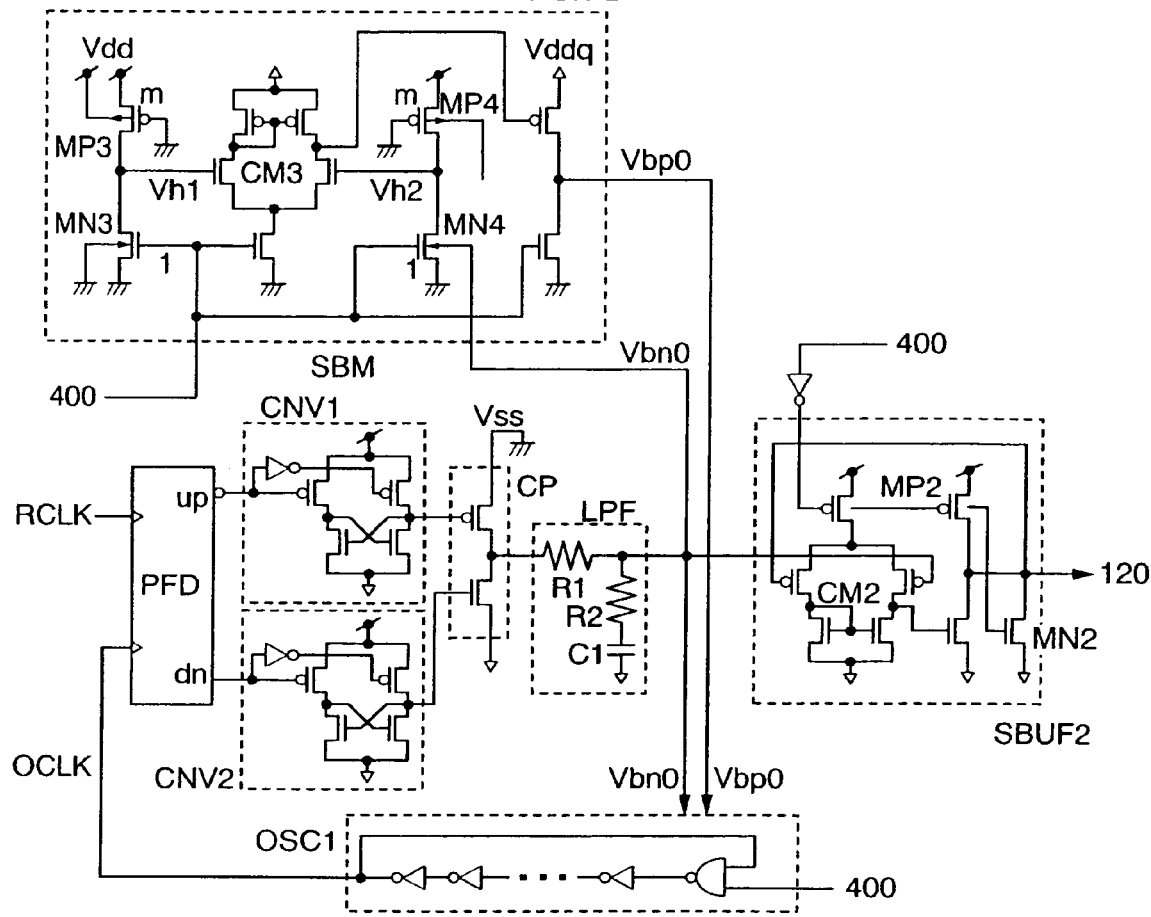
FIG. 8 is a circuit diagram of an embodiment of a substrate bias control circuit shown in FIG. 7.

FIG. 8 shows an embodiment of the substrate bias control circuit 100 shown in FIG. 7. The present embodiment can be realized by a construction in which the substrate bias buffer SBUF1 is removed from the embodiment shown in FIG. 3. Namely, the bias 120 provides a signal identical to the NMOS substrate bias 111 shown in FIG. 1. The circuit operation of the embodiment shown in FIG. 8 will be omitted since it is similar that of the embodiment shown in FIG. 3.

Figure 9:
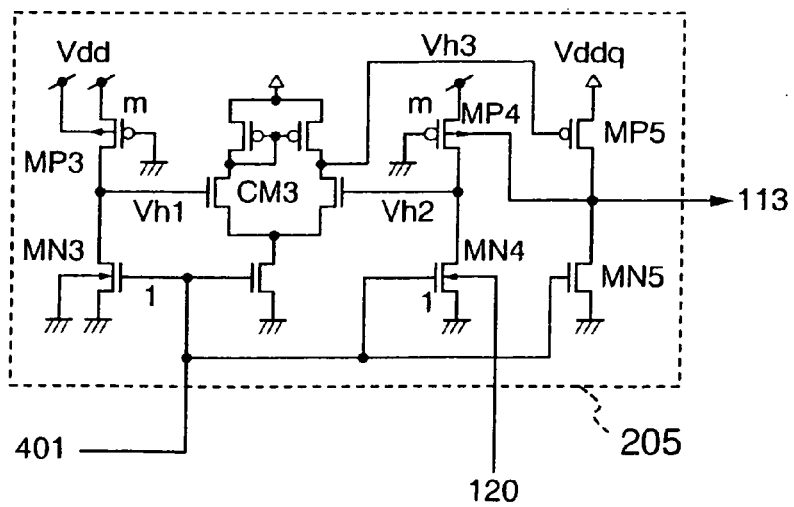
FIG. 9 is a circuit diagram of an embodiment of a PMOS substrate bias switch shown in FIG. 7.

FIG. 9 shows an embodiment of the substrate bias 205 of FIG. 7 in the case where the circuit shown in FIG. 8 is used for the substrate bias control circuit 100 shown in FIG. 7. In this case, the circuit shown in FIG. 6B can be used as the substrate bias switch 204 as it is.

The circuit shown in FIG. 9 is identical to a substrate bias mirror circuit in the embodiment shown in FIG. 8. The circuit is inputted with the substrate bias 120 and outputs the substrate bias 113. The operation of the circuit shown in FIG. 9 will now be described in detail.

Though there is no special limitation, it is assumed for the simplification of explanation that 401 is "H", Vddq=3.3 V, Vdd=1.0 V, Vss=0.0 V and Vssq=−2.3 V.

Symbols MP3 to MP5 denote PMOSFET's and symbols MN3 to MN5 denote NMOSFET's. The gate lengths of MP3 and MN3 are equal to each other and a ratio in w (gate width) therebetween is set to be m:1. Similarly, the gate lengths of MP5 and MN5 are equal to each other and a ratio in w (gate width) therebetween is set to be m:1. Symbol CM3 denotes a differential amplifier which amplifies a potential difference between Vh1 and Vh2 and inputs its output Vh3 to the gate of MP5.

A voltage divider composed of MP3 and MN3 outputs a voltage Vh1 corresponding to the driving abilities of MP3 and MN3. Namely, when Vh1 is 0.5 V (=(Vdd+Vss/2)+Vss), it is meant that the driving capabilities of MP3 and MN3 are equal to each other. Now assume that the driving capabilities of MP3 and MN3 are equal to each other and hence Vh1 is 0.5 V.

Since the output Vh3 of the differential amplifier CM3 controls the substrate bias of MP4 so that the potential of VH2 is controlled, the differential amplifier CM3 is applied with a negative feedback. In a steady state, therefore, the potential of Vh2 becomes equal to the potential of Vh1 or takes 0.5 V.

A voltage divider composed of MP4 and MN4 outputs a voltage Vh2 corresponding to the driving capabilities of MP3 and MN3. Therefore, when the potential of Vh2 is 0.5 V, it is meant that the driving capabilities of MP4 and MN4 are equal to each other.

Accordingly, when a ratio in w between MP3 and MN3 and a ratio in w between MP4 and MN4 are set to the same value, there results in that the potential of the substrate bias 113 is outputted in regard to the inputted substrate bias 120 while keeping a ratio in driving capability between MP4 and MN4 when the potential of the substrate bias is made the same as the source potential.

As mentioned above, the substrate biases 120 and 113 should not be determined independently of each other. For example, it is necessary that the drain currents per unit gate width (or driving capabilities) of a PMOSFET and an NMOSFET having their back gates applied with those substrate biases 120 and 113 hold a proper ratio such as 2:1 therebetween. This can be realized by the circuit shown in FIG. 9.

Also, it is general that the dependency of a threshold voltage on a substrate bias as well as the dependency of a drain current per unit gate width associated with a change in supply voltage are different between a PMOSFET and an NMOSFET. For example, as the supply voltage decreases, a decrease in driving capability of the PMOSFET becomes more remarkable than that of the NMOSFET. With the use of the substrate bias mirror circuit SBM of the present invention shown in FIG. 9, it is also possible to make compensation for the above differences in dependency.

In FIG. 9, when 401 is "L", Vddq is outputted to the substrate bias 113. Further, currents supplied to the voltage divider composed of MP3 and MN3, the voltage divider composed of MP4 and MN4, and the differential amplifier CM3 are turned off so that the power consumption becomes small.

Figure 10:
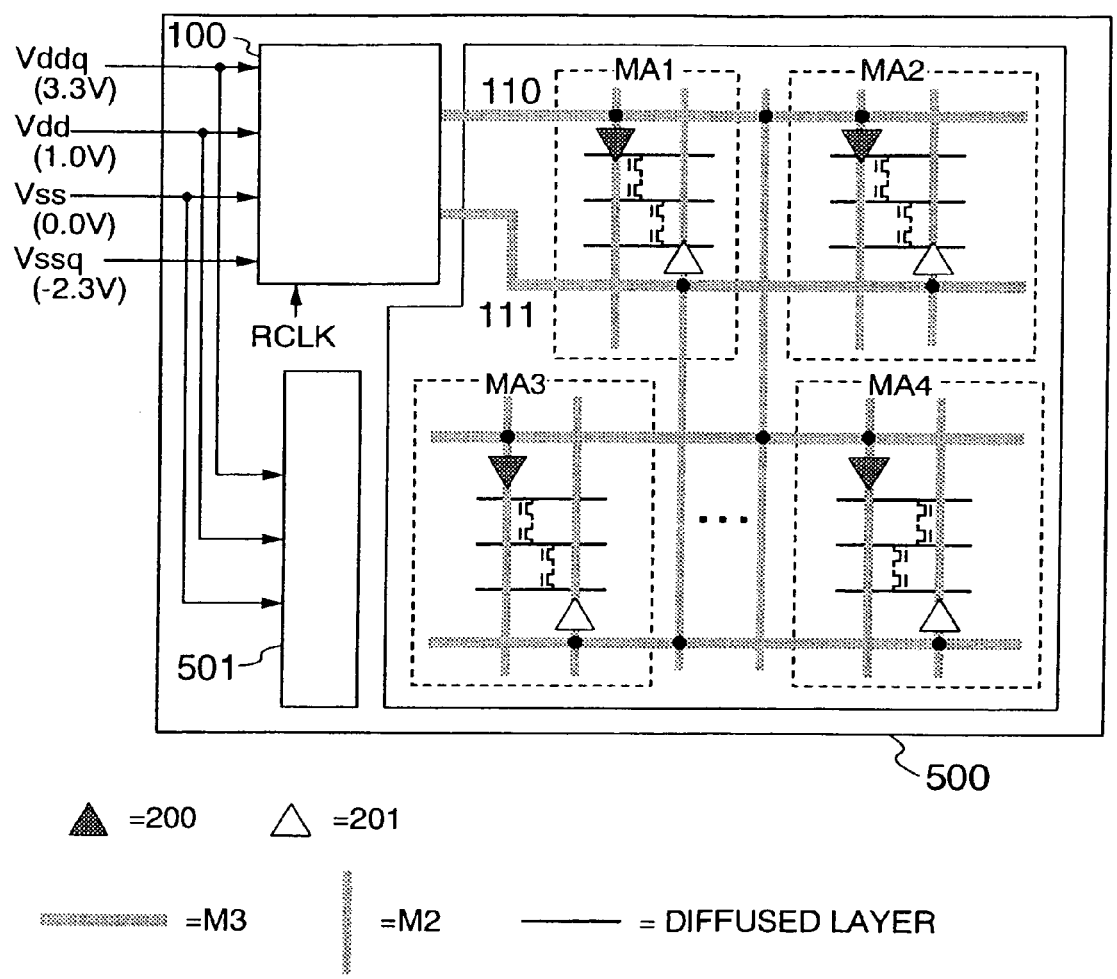
FIG. 10 is a block diagram of an embodiment showing a substrate bias distributing method when the present invention is applied to a microprocessor.

FIG. 10 shows an embodiment of wiring for power supply to the substrate biases 110 and 111. The power control circuit and standby signals outputted therefrom are omitted for simplification.

Numeral 500 denotes, for example, a microcomputer. An internal power source of the microcomputer is supplied by Vdd and Vss. Numeral 501 denotes an I/O circuit for external interface which is supplied with a voltage Vddq higher than Vdd. Though there is no special limitation, an example of the power supply voltage potentials is such that Vddq=3.3 V, Vdd=1.0 V, Vss=0.0 V and Vssq=−2.3 V. With this voltage setting, there is a merit that a potential difference of Vddq−Vss and a potential difference of Vdd−Vssq are the same, thereby facilitating a device design.

A circuit in the microprocessor is divided into four substrate control blocks MA1 to MA4. Numerals 200 and 201 denote the similar to the substrate bias switches shown in FIG. 1. Though no limitation is imposed on a supply source of a reference clock signal RCLK, it may be generated from a clock signal in the microprocessor 500.

In the shown example, the power supply to the substrate biases 110 and 111 is made using a method according to an invention of JP-A-8-314506. Namely, the power supply of a substrate bias to each transistor is made, through a second metal layer M2 from a third metal layer M3, by a surface high-concentration diffused layer DL for taking in a substrate potential.

Since a first metal layer is not used, it is possible to package each transistor with a high density.

The method for use of metal in the present embodiment is not limited to the disclosed example.

Figure 11:
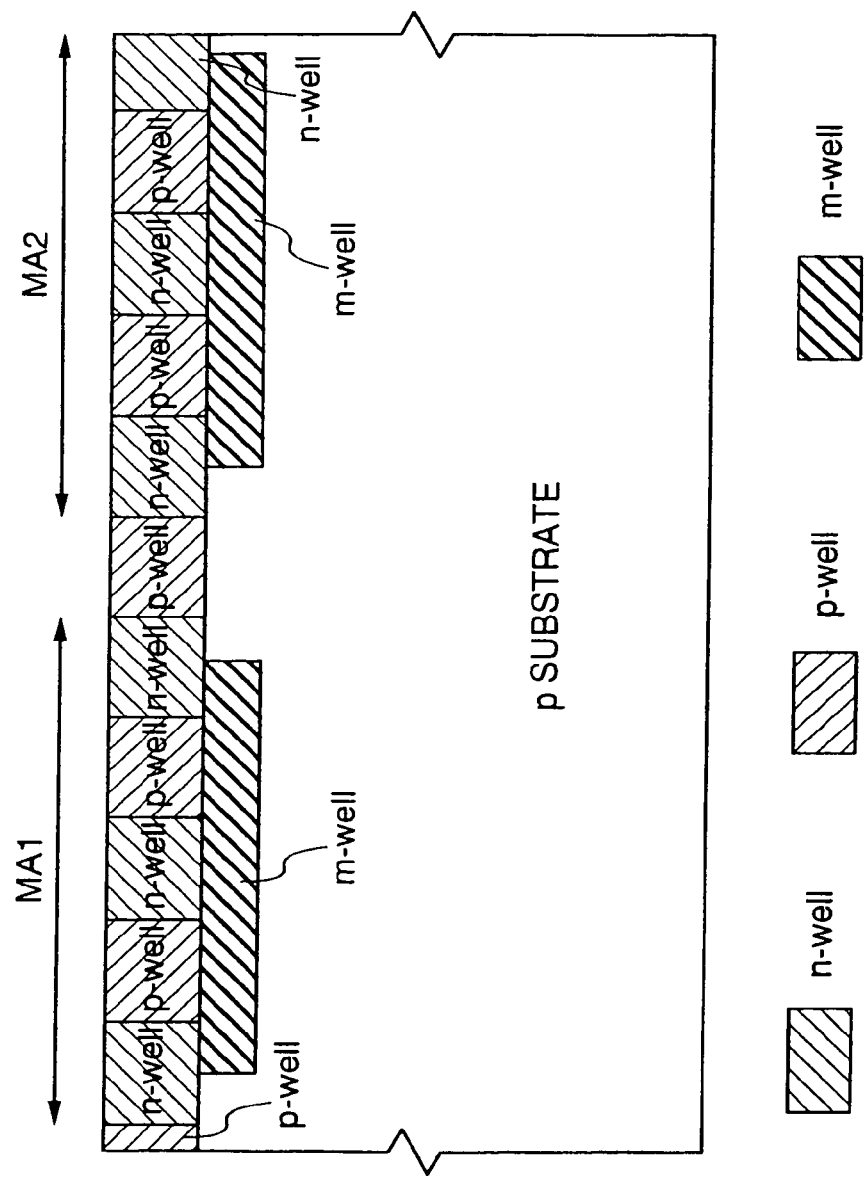
FIG. 11 is a plan view showing an example of a substrate structure for realizing the present invention.

FIG. 11 shows an example of the cross section of a substrate structure (or well structure) which realizes the embodiment shown in FIG. 10. A substrate has n-wells and p-wells alternately arranged on the surface thereof. The circuit can be packaged by forming transistors in the surface structure. An m-well is a well having an n polarity.

The n-well in the substrate control block MA1 and the n-well in the substrate control block MA2 are electrically isolated by the p-substrate. The p-well in the substrate control block MA1 and the p-well in the substrate control block MA2 are electrically isolated by the m-well having the n polarity.

Accordingly, it is possible to apply independent biases to a PMOSFET in the substrate control block MA1, a PMOSFET in the substrate control block MA2, an NMOSFET in the substrate control block MA1 and an NMOSFET in the substrate control block MA2. Thereby, the circuit shown in FIG. 10 can be realized.

In FIG. 3, 5 or 8, the above-mentioned operation is performed when 400 is "H". On the other hand, when 400 is "L", the oscillation of the frequency-variable oscillation circuit OSC1 or OSC2 is stopped so that the substrate bias mirror circuit SBM and the substrate bias buffers SBUF1 and SBUF2 are brought into low-power conditions. Accordingly, the power consumption of the whole of the circuit becomes small.

In the microprocessor using the present invention, the power consumption of the microprocessor at the time of standby can be reduced by connecting the signal of 400 to a standby signal of the microprocessor.

Alternatively, 400 may be turned into "L" at the time of IDDQ test of the microprocessor. Since a leakage current flowing in the circuit shown in FIG. 3, 5 or 8 becomes small and a substrate bias having a large value is outputted to the substrate bias 110 or 111, it is possible to reduce a sub-threshold leakage current of an MOSFET the threshold value of which is controlled by the substrate bias 110 or 111.

When 400 is "L", the outputs UP and DN of the phase/frequency compare circuit PFD, PFD1 or PFD2 may be fixed to "H" and "L", respectively. The discharge of a capacitor C1 in the low-pass filter LPF, LPF1 or LPF2 at the time of "L" of 400 is suppressed. Since the potential of the capacitor C1 is held even if 400 is switched at a high frequency, it is possible to reduce a power consumption by an amount corresponding to the charge/discharge of the capacitor C1.

In the foregoing embodiment, no special limitation is imposed on the structure of the transistor and the structure of the substrate. There may be used a MOS transistor with SOI structure as disclosed by IEDM Technical Digest, pp. 35–38, 1992. The essential thing is a transistor having a structure in which the threshold value can be controlled.

With the foregoing embodiment, the following effects can be obtained.

(1) By dividing the main circuit LOG0 in the prior art A into a plurality of substrate control blocks by use of PMOS and NMOS substrate bias switches, it is possible to control the substrate bias of each circuit block independently of a substrate bias control circuit.

By making the individual control of the substrate bias to control the substrate bias of a circuit block which is being stopped, as mentioned above, it is possible to reduce a sub-threshold leakage current of that circuit block, thereby reducing the effective power consumption of the whole of the main circuit.

Further, since the substrate bias of the circuit block can be controlled by use of the PMOS substrate bias switch and the NMOS substrate bias switch independently of the substrate bias control circuit, it is possible to shorten a time necessary for the transfer of the circuit block from a stopped condition to an operating condition or from the operating condition to the stopped condition. Accordingly, even if the standby signal 401 or 402 is changed at a high frequency so that the operating condition of the circuit block is changed at the high frequency, the performance of the system is not deteriorated.

(2) In the example in the prior art A, the signal B0 inputted to the main circuit LOG0 is a signal corresponding to the signal B1 inputted to the frequency-variable oscillation circuit OSC0. In an embodiment of the present invention, a substrate bias corresponding to the signal B0 is particularly generated from a substrate bias corresponding to the signal B1 by use of a substrate bias buffer. Thereby, even if a large load is connected to the substrate bias corresponding to the signal B0, no influence is exerted on the substrate bias corresponding to the signal B1. Accordingly, the design of a phase locked loop system for generating the substrate bias corresponding to the signal B1 is facilitated and a time until the phase locked loop system becomes stable (or a lock time) can be shortened.

Specific embodiments of the present invention concerning a cell layout will now be described in reference to the drawings.

Figure 12:
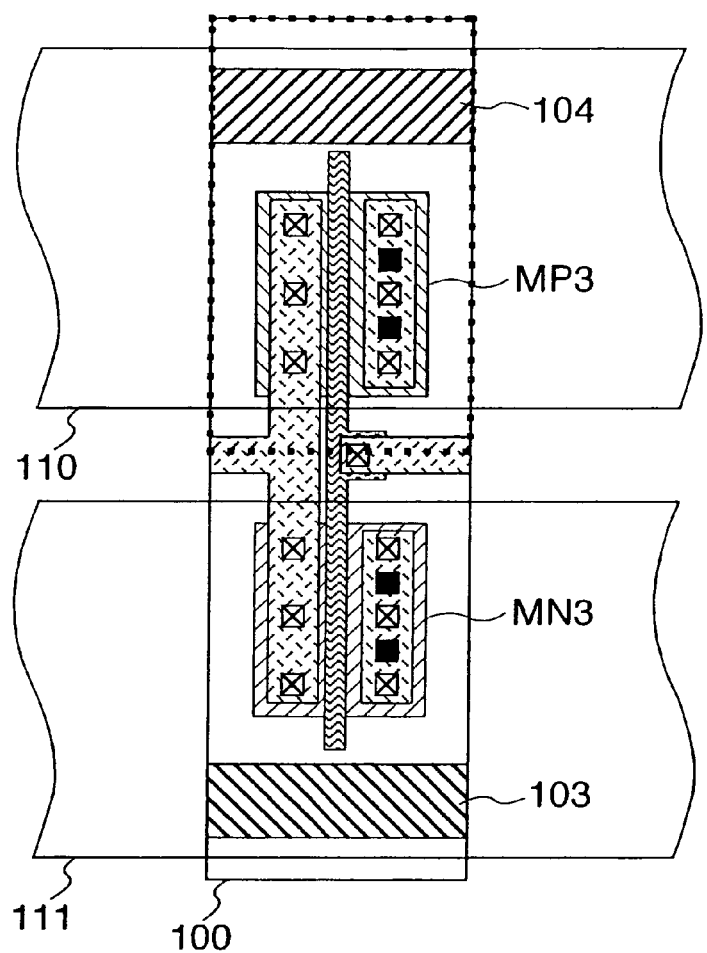
FIG. 12 is a plan view of another simple embodiment of the present invention.

FIG. 12 shows an embodiment of the most simple CMOS inverter according to the present invention. A PMOS denoted by symbol MP3 is composed of P-type diffused (or impurity) layers forming the source/drain of the PMOS and a gate electrode, and an NMOS denoted by symbol MN3 is composed of N-type diffused (or impurity) layers forming the source/drain of the NMOS and a gate electrode. Numeral 110 denotes a second metal layer which is supplied with VDD. Numeral 111 denotes a second metal layer which is supplied with VSS.

The PMOS substrate or well bias of the PMOS MP3 is supplied from a PMOS substrate or well diffused (or impurity) layer 104 and is not connected to the second metal layer 110. The NMOS substrate or well bias of the NMOS MN3 is supplied from an NMOS substrate or well diffused (or impurity) layer 103 and is not connected to the second metal layer 111.

In the embodiment shown in FIG. 12, the substrate or well bias of the PMOS and the substrate or well bias of the NMOS can thus be set to potentials other than VDD and VSS, respectively.

Figure 14:
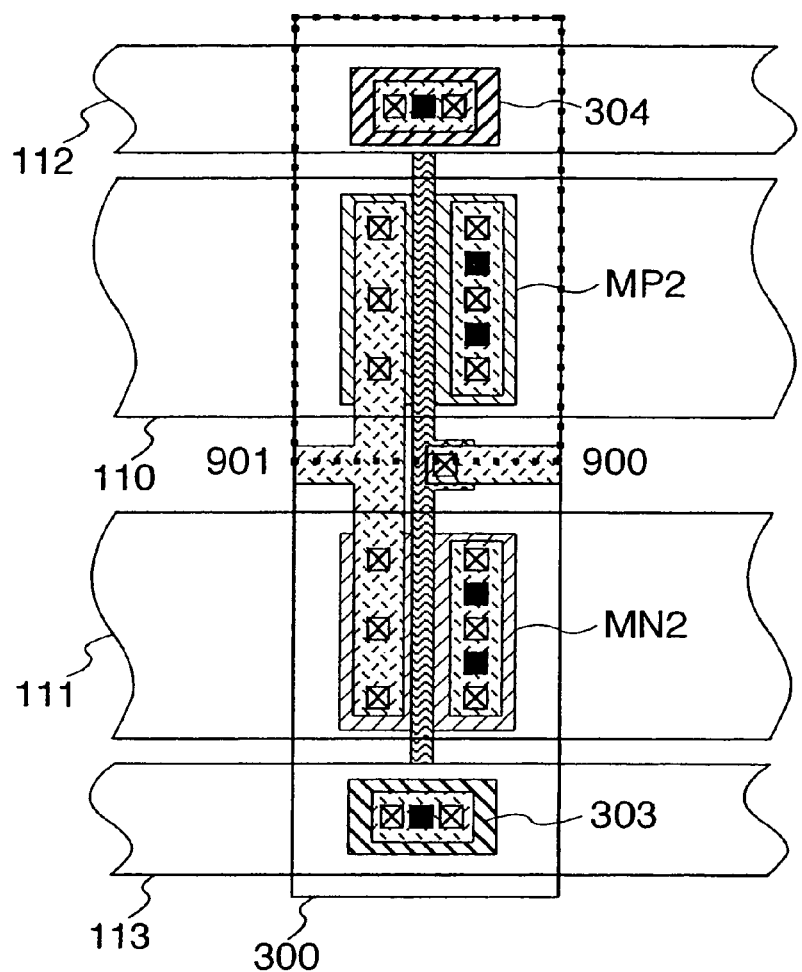
FIG. 14 is a plan view showing the prior art 2.
Figure 15A:
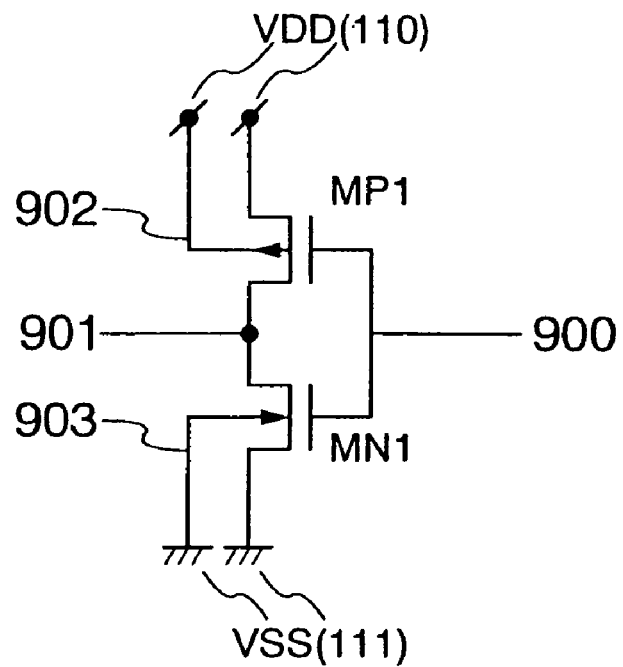
FIG. 15A is a circuit diagram corresponding to FIG. 13.
Figure 15B:
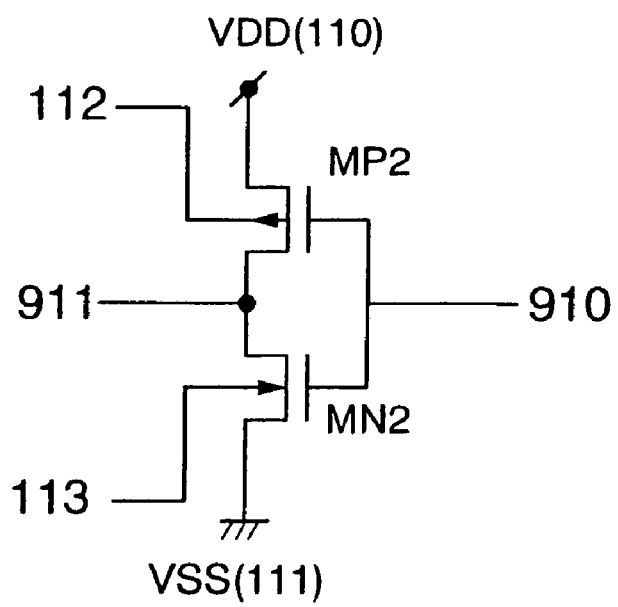
FIG. 15B is a circuit diagram corresponding to FIG. 12 or 14.

Though the cell of the present embodiment has a function similar to that of the cell of the prior art shown in FIG. 14, the second metal layer is not used since the substrate or well bias is supplied from the substrate or well diffused (or impurity) layer. Thereby, it is possible to solve the first to third problems simultaneously.

Since the resistance of the PMOS substrate or well diffused (or impurity) layer or the NMOS substrate or well diffused (or impurity) layer is smaller than the substrate or well resistance of the PMOS or NMOS by about one order, it is possible to supply the substrate or well bias stably. If the PMOS substrate or well diffused (or impurity) layer or the NMOS substrate or well diffused (or impurity) layer is converted into a silicide, the above resistance can be lowered further by about two orders, thereby making it possible to supply the substrate or well bias more stably.

Figure 16:
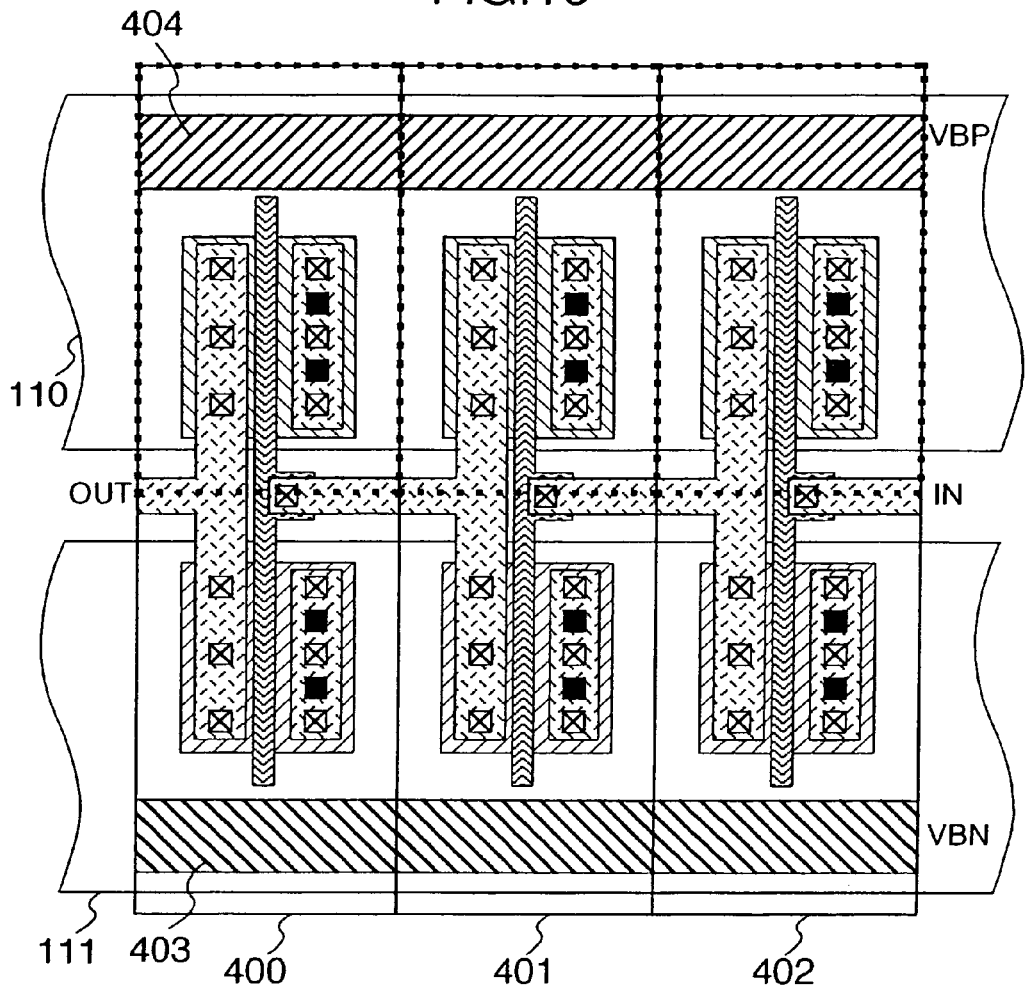
FIG. 16 is a plan view of an embodiment when

FIG. 16 is a diagram showing the layout of a three-stage inverter row in which three CMOS inverter cells shown in FIG. 1 are arranged right and left. Each of the PMOS substrate or well diffused (or impurity) layer 104 and the NMOS substrate or well diffused (or impurity) layer 103 shown in FIG. 12 is extended to the right and left ends of the cell. Therefore, as shown in FIG. 16, either PMOS substrate or well diffused (or impurity) layers 404 or NMOS substrate or well diffused (or impurity) layers 403 of the respective cells can be connected by merely arranging the cells right and left. Of course, it can be constructed so that with no substrate or well diffused (or impurity) layer being provided in the cell in FIG. 12, the substrates or wells of the respective cells are thereinstead connected at once by a substrate or well diffused (or impurity) layer at the time of layout/wiring of cells.

Figure 13:
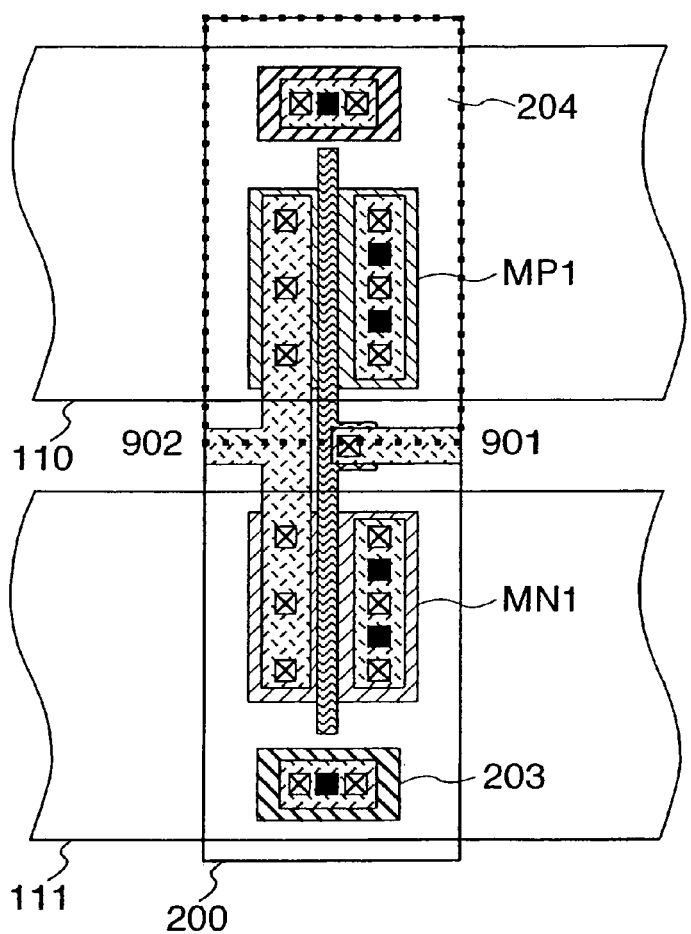
FIG. 13 is a plan view showing the prior art 1.
Figure 17:
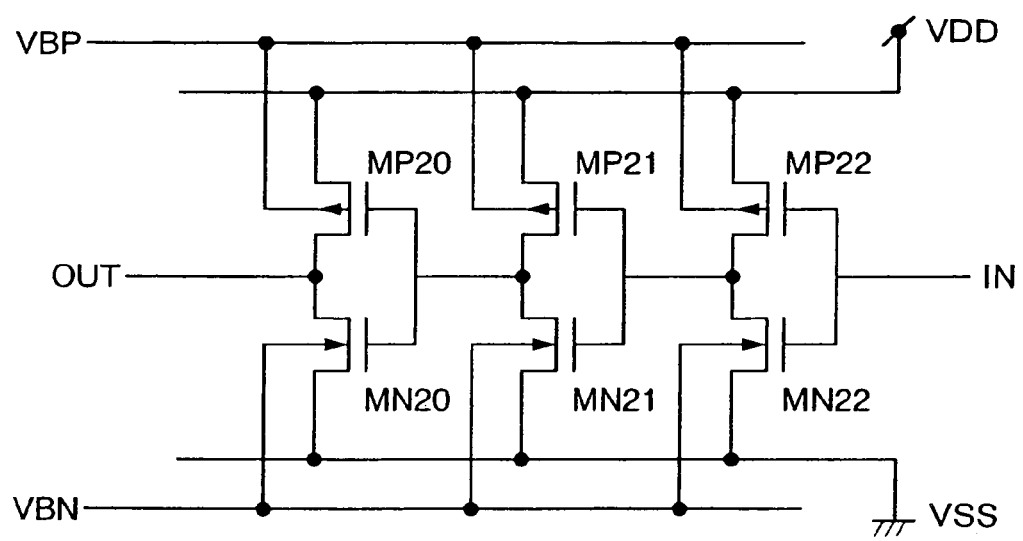
FIG. 17 is a circuit diagram corresponding to FIG. 16.

FIG. 17 shows the representation of FIG. 16 by a circuit diagram. With the substrate or well bias distributing method of the present invention, there is no need to use a metal layer in order to supply the substrate or well bias of each cell and hence the circuit can be realized without a large improvement of the conventionally used layout shown in FIG. 13. Therefore, the conventional CAD tool used for the layout/wiring of the conventional cell can be used as it is.

In FIGS. 12 to 16, the CMOS inverter has been described by way of example. However, the application to any circuit is possible so far as the circuit uses a PMOS and an NMOS. At this time, the determination of the position of a PMOS substrate or well diffused (or impurity) layer or an NMOS substrate or well diffused (or impurity) layer on both ends of each cell suffices in order to connect the PMOS substrate or well diffused (or impurity) layers or the NMOS substrate or well diffused (or impurity) layers by merely arranging cells right and left, as shown in FIG. 16.

What is essential is that PMOS substrate or well diffused (or impurity) layers or NMOS substrate or well diffused (or impurity) layers of the respective cells are connected with no use of a metal layer used for inter-cell power supply and with no hindrance to in-cell and inter-cell wirings.

In the examples shown in FIGS. 12 to 16, the second metal layer is used for power supply in the case where the wirings up to the second metal layer are used. However, another method of use of metal layers may be employed. The power supply to a substrate or well may be made by a wiring material which is used as neither a wiring for a signal line nor a wiring for a power supply line.

In the embodiment shown in FIG. 12, a single-well structure using an n-well is employed. However, there can be employed a twin-well structure using both an N-well and P-well no matter what the structure of a transistor and the structure of a substrate or well may be. There may be used a MOS transistor with triple-well structure as disclosed by ISSCC Digest of Technical Papers, pp. 248–249, February 1989 and a MOS transistor with SOI structure as disclosed by IEDM Technical Digest, pp. 35–38, 1992. Though the P-type silicon wafer is used in FIG. 12, an N-type silicon wafer may be used.

Figure 18A:
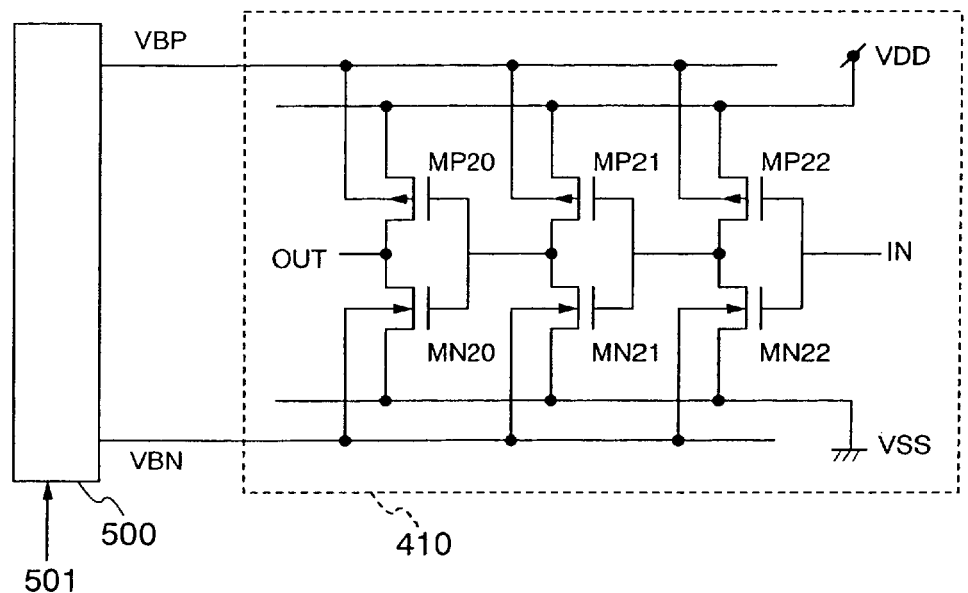
FIG. 18A is a circuit diagram of an embodiment when a substrate or well bias control circuit is connected to FIG. 16.

Referring to FIG. 18A, a substrate or well bias control circuit 500 is added to the three-stage inverter row shown in FIGS. 16 and 17, thereby making it possible to control the threshold value of the MOS transistor.

Numeral 410 denotes the three-stage inverter row shown in FIGS. 16 and 17, symbol VBP the substrate or well bias of a PMOS, and symbol VBN the substrate or well bias of an NMOS. Numeral 501 denotes a substrate or well bias control terminal which includes one or more control lines and controls potentials supplied to the substrate or well biases VBP and VBN.

Figure 18B:
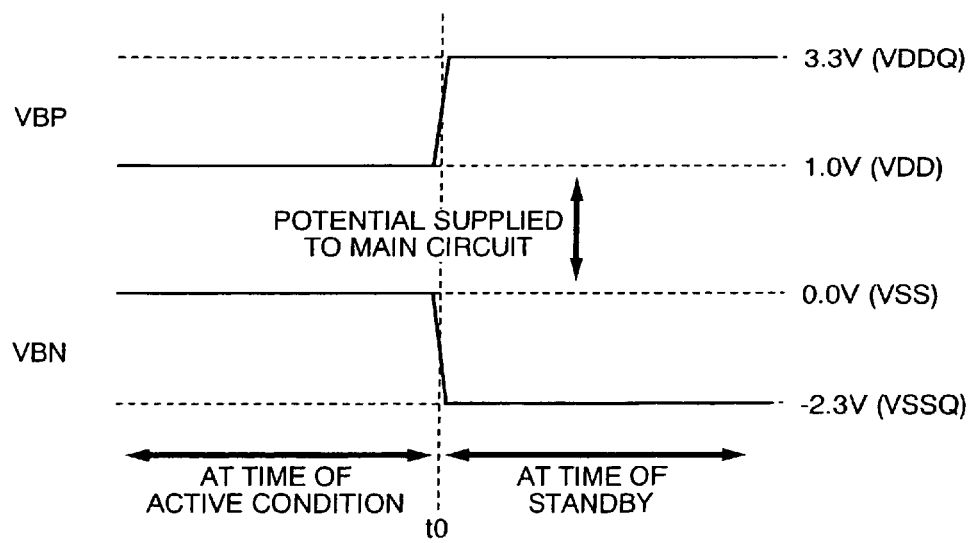
FIG. 18B is a timing chart of an example of the operation of the circuit shown in FIG. 18A.

FIG. 18B shows an example of the substrate or well bias control of the substrate or well bias control circuit 500. Up to an instant of time t0, the three-stage inverter row is in an operating mode (or at the time of active condition) and the substrate or well biases VBP and VBN are applied with power supply potentials VDD (1.0 V) and VSS (0.0 V), respectively. After the instant of time t0, the three-stage inverter row is in a non-operating mode (or at the time of standby) and the substrate or well biases VBP and VBN are applied with power supply potentials VDDQ (3.3 V) and VSSQ (−2.3 V), respectively. By thus controlling the substrate or well bias, the threshold value of the MOS transistor at the time of standby is controlled to a high value. The sub-threshold leakage current flowing between the source and the drain of the MOS transistor can be made small, thereby making it possible to reduce the power. At the time of active condition, the threshold value of the MOS transistor is controlled to a low value and hence the ON resistance of the MOS transistor can be lowered, thereby making it possible to operate the three-stage inverter at a high speed.

Figure 19:
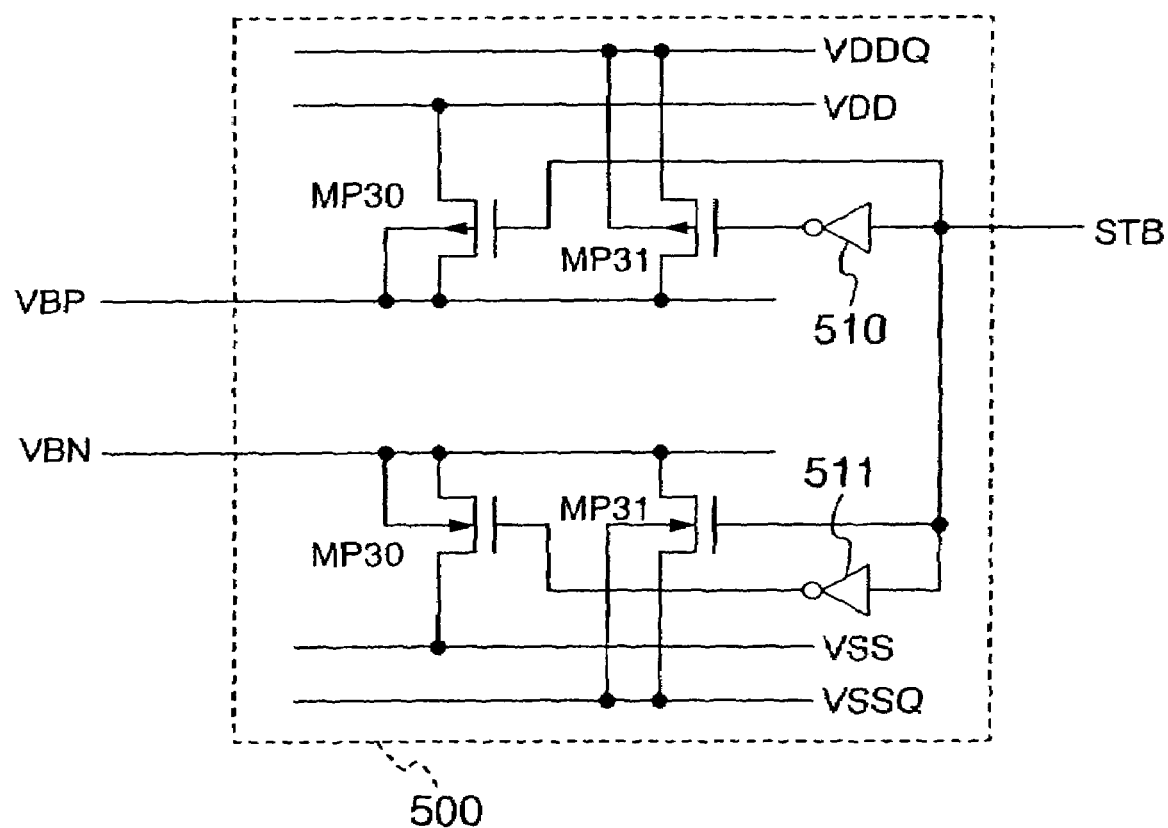
FIG. 19 is a circuit diagram of an embodiment of the substrate or well bias control circuit shown in FIG. 18A.

FIG. 19 shows an embodiment of the substrate or well bias control circuit 500 shown in FIG. 18A. Symbol STB denotes the substrate or well bias control terminal 501 shown in FIG. 18A. Numerals 510 and 511 denote inverter circuits which inversely amplify the amplitude of STB to allow the complete ON/OFF operation of either PMOS's MP30 and MP31 or NMOS's MN30 and MN31 (in which the gate potential of each MOS transistor does not take an intermediate potential between the source and drain potentials).

When STB is the VSS potential (0.0 V), the PMOS MP30 and the NMOS MN30 are turned on so that the substrate or well biases VBP and VBN are applied with VDD (1.0 V) and VSS (0.0 V), respectively. When STB is the VDD potential (1.0 V), the PMOS MP31 and the NMOS MN31 are turned on so that the substrate or well biases VBP and VBN are applied with VDDQ (3.3 V) and VSSQ (−2.3 V), respectively.

In the embodiment shown in FIG. 19, the respective substrates or wells of the PMOS MP30 and MP31 and the NMOS MN30 and MN31 are set to different potentials. Accordingly, it is required that the substrate or well bias control circuit 500 shown in FIG. 19 should be formed with a triple-well structure. In this case, the three-stage inverter 410 in FIG. 18A may have a single-well or twin-well structure with only the substrate or well bias control circuit 500 being formed with the three-well structure. Of course, the three-stage inverter 410 may also have a triple-well structure.

Figure 20A:
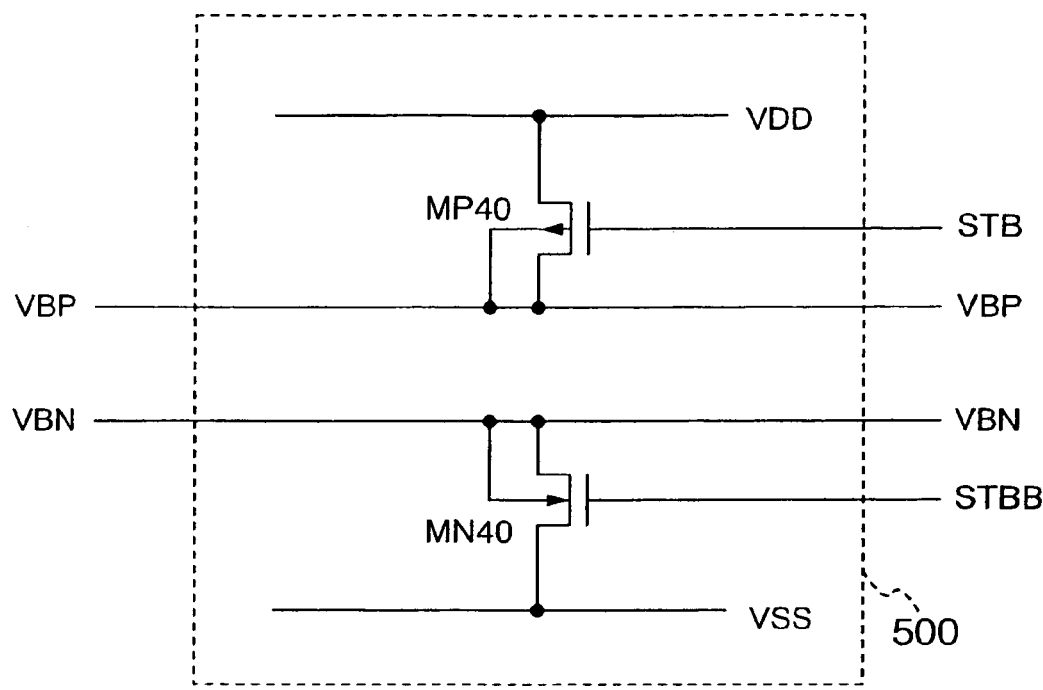
FIGS. 20A and 20B are circuit diagrams of further embodiments of the substrate or well bias control circuit shown in FIG. 18A.

FIG. 20A shows another embodiment of the substrate or well bias control circuit 500 shown in FIG. 18A. STB, STBB, VBP and VBN correspond to the substrate or well bias control terminal 501 shown in FIG. 18A. In FIG. 20A, the substrate or well biases VBP and VBN are directly controlled. Namely, in order to realize FIG. 18B, VBP and VBN are respectively applied with VDD (1.0 V) and VSS (0.0 V) at the time of active condition and with VDDQ (3.3 V) and VSSQ (−2.3 V) at the time of standby.

Symbol MP40 denotes a PMOS, and symbol MN40 denotes an NMOS. At the time of active condition, a substrate or well current flows. Therefore, it is necessary to make the impedance of each of the substrate or well biases VBP and VBN sufficiently small. In order to realize this, VSS (0.0 V) and VDD (1.0 V) are respectively applied to STB and STBB at the time of active condition. Since the PMOS MP40 and the NMOS MN40 are turned on, each of the substrate or well bias VBP, the substrate or well bias VBN, VDD (1.0 V) and VSS (0.0 V) is connected to a low impedance. At the time of standby, the PMOS MP40 and the NMOS MN40 can be brought into their turned-off conditions by applying VDDQ (3.3 V) and VSSQ (−2.3 V) to STB and STBB, respectively.

Figure 20B:
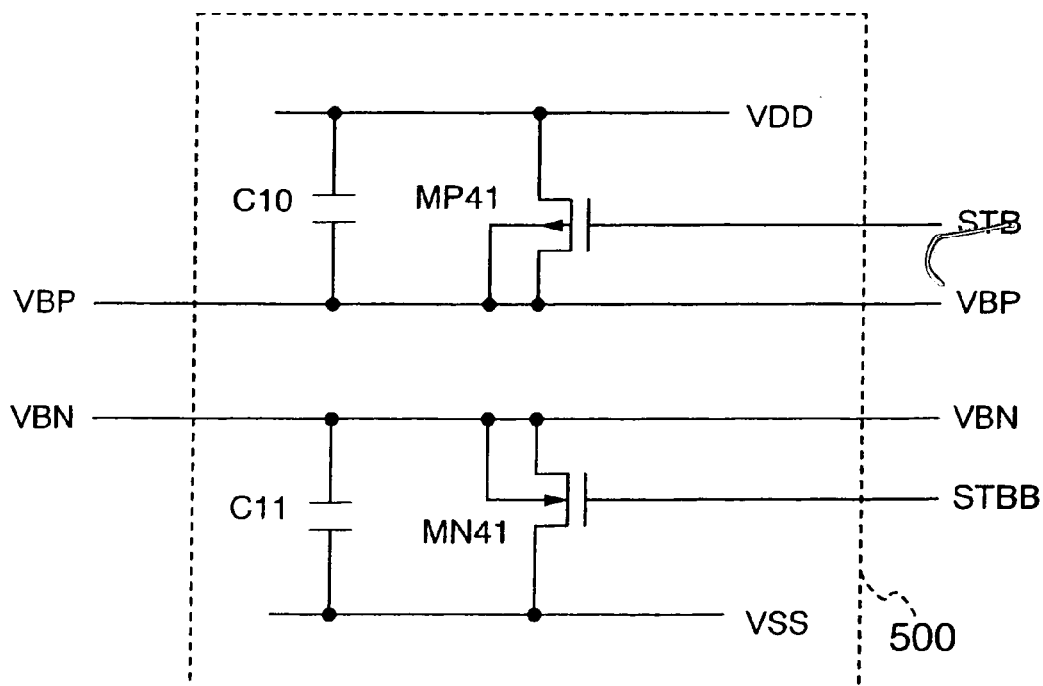

FIG. 20B shows an example in which capacitors C10 and C11 are newly incorporated into the circuit shown in FIG. 20A. The capacitor C10 is connected between VDD and the substrate or well bias VBP, and the capacitor C11 is connected between VSS and the substrate or well bias VBN. By coupling the substrate or well bias and the power supply by the capacitor, the ringing of the power supply can be transferred to the substrate or well bias. In general, the ringing of the power supply is larger than the ringing of the substrate or well and a difference in potential between the substrate or well and source of a MOS transistor greatly changes by virtue of a change in power supply potential or source potential. By connecting the capacitor C10 or C11, the potential between the substrate or well and source of the MOS transistor can be kept constant at a certain degree.

In FIG. 20B, the capacitors C10 and C11 are placed in the substrate or well bias control circuit. However, they may be placed in a circuit formed by MOS transistors having their substrates or wells controlled by the substrate or well biases VBP and VBN (for example, the three-stage inverter circuit in FIG. 18A). Also, they may be placed in the substrate or well bias control circuit shown in FIG. 19. It is apparent that the capacitors are effective as the number thereof is large and as they are distributed all around. A method for realization of the capacitor may be arbitrary. For example, it can be realized by a gate capacitance.

Figure 21:
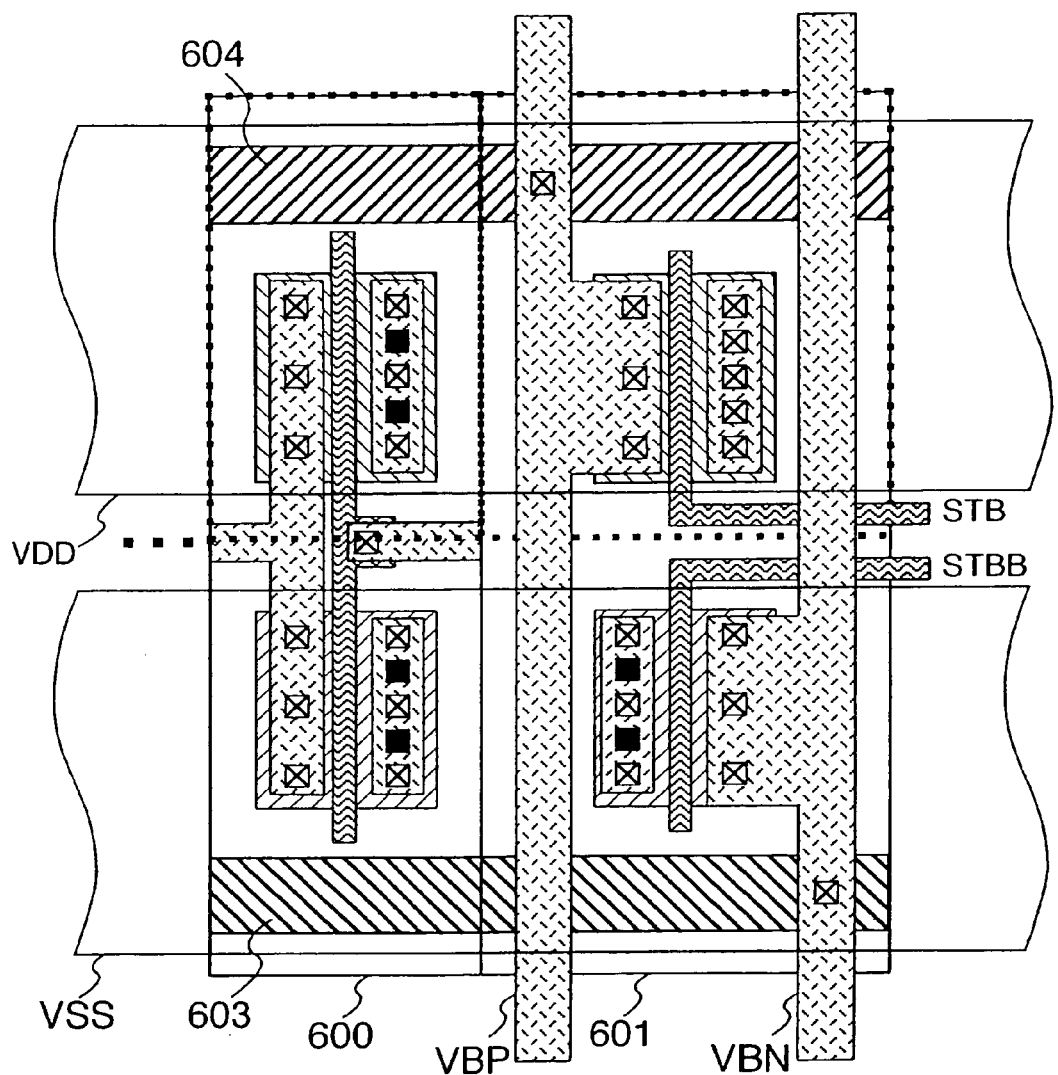
FIG. 21 is a plan view of an embodiment when

FIG. 21 is a layout diagram corresponding to FIG. 20A. Numeral 601 denotes the substrate or well bias control circuit 500, and numeral 600 denotes the inverter shown in FIG. 12. The substrate or well bias of the inverter is supplied from a PMOS substrate or well diffused (or impurity) layer 604 and an NMOS substrate or well diffused (or impurity) layer 603.

Figure 22:
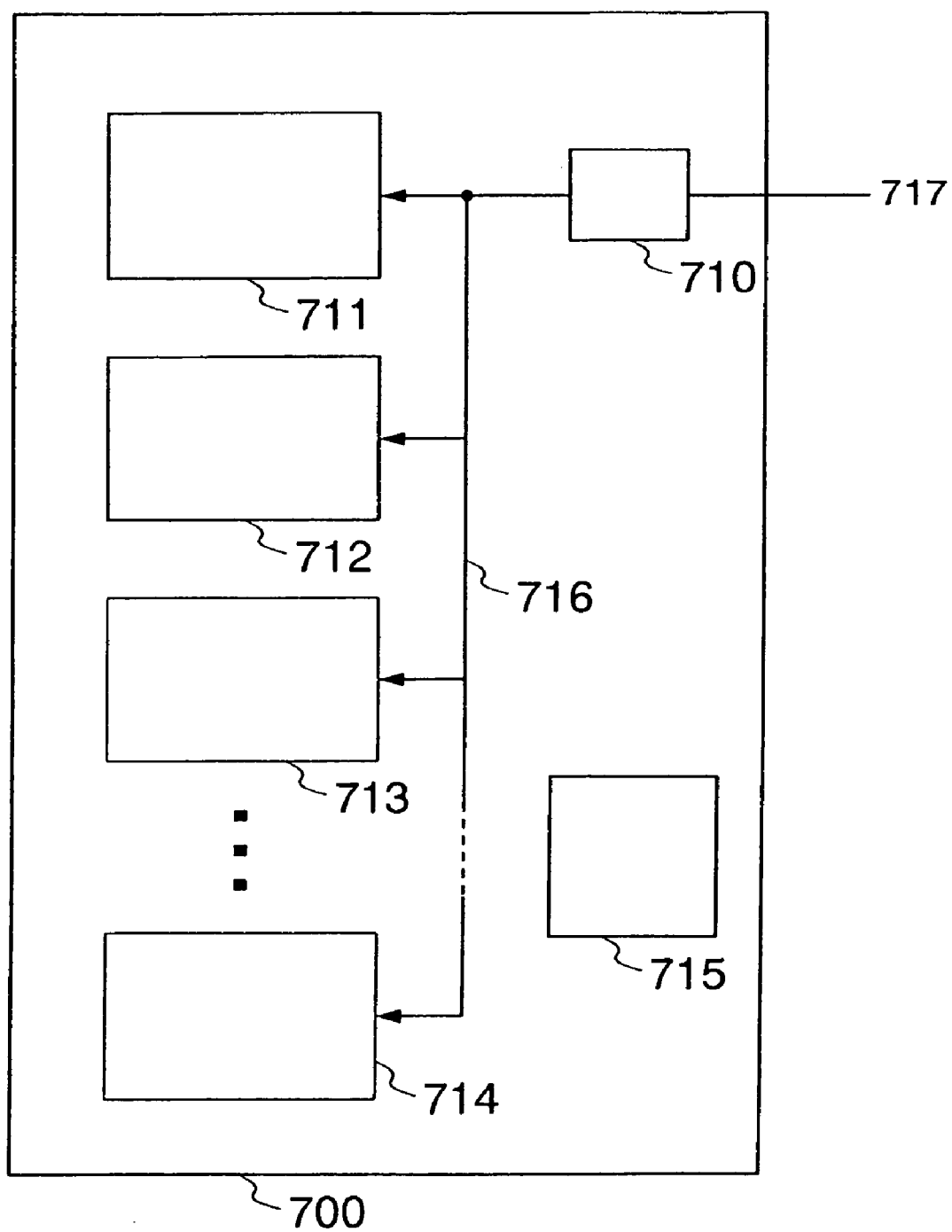
FIG. 22 is a block diagram of an embodiment of a microprocessor using the present invention.

A block 700 shown in FIG. 22 is an embodiment of a microprocessor using the present invention. Numerals 711 to 714 denote circuit blocks each of which is composed of a circuit having a need for the control of a substrate or well bias and a substrate or well bias control circuit. FIG. 18A is an example of such a circuit block. The division into a multiplicity of circuit blocks (711 to 714) is made in order to setting a substrate or well potential in each circuit block to a sufficiently low impedance.

Numeral 716 denotes a substrate or well bias control terminal which is connected to an external terminal 717 through an interface circuit 710 for the exterior. Numeral 715 denotes a circuit block which has no need for the control of a substrate or well bias.

The operation mode of the microprocessor 700 can be changed to either an active condition or a sleeve condition by virtue of the external terminal 717.

In FIG. 22, the operation mode of the microprocessor 700 is changed by the external terminal 717. However, it may be changed by the value of a register in the microprocessor.

In FIG. 22, the substrate or well bias supply method of the present invention can be used for all of the circuit blocks 711 to 714. However, the conventional substrate or well bias supply method as shown in FIG. 14 may be used particularly for those of the circuit blocks in which a large substrate or well current flows.

In the foregoing embodiments, the potentials applied to the substrate or well biases are only VDD (1.0 V) and VSS (0.0 V) at the time of active condition and VDDQ (3.3 V) and VSSQ (−2.3 V) at the time of standby. However, they are not limited to the disclosed example. At the time of active condition, proper potentials may be applied to the substrate or well biases to enable the adjustment of the variations in threshold values of the MOS transistors.

In the foregoing embodiments, the threshold voltage of the MOS transistor is made low when the operation mode of the circuit is an active condition and high when it is a standby condition. However, the substrate or well bias may be set so that the threshold value is made high at the time of IDDQ test as shown by IEEE SPECTRUM, pp. 66–71, 1996.

In the case where the threshold value of the MOS transistor at the time of IDDQ test is made high in the embodiment of the substrate or well bias control circuit shown in FIG. 20A, STB and VBP may be applied with VDDQ (3.3 V) while STBB and VBN may be applied with VSSQ (−2.3 V).

At the time of delivery, the setting for application of VSS (0.0 V) to STB, VDD (1.0 V) to VBP, (1.0 V) to STBB and VSS (0.0 V) to VBN may be made by means such as bonding.

As mentioned above, the improvement in power supplying capability and the reduction in area can be attained in accordance with the present invention.

We claim:

1. A semiconductor integrated circuit device comprising:
a circuit block including a first MIS transistor of a first conductivity type and a second MIS transistor of a second conductivity type; and
a well bias voltage controller to generate a first well bias voltage for the first MIS transistor and a second well bias voltage for the second MIS transistor,
wherein the well bias voltage controller determines the first well bias voltage and the second well bias voltage while holding a ratio in driving capability between the first MIS transistor applied with the first well bias voltage and the second MIS transistor applied with the second well bias voltage.

2. The semiconductor integrated circuit device according to claim 1,
wherein the driving capability is defined by a drain current per unit gate width.

3. The semiconductor integrated circuit device according to claim 1,
wherein the well bias voltage controller includes a differential amplifier,
wherein one input of the differential amplifier is for receiving a voltage based on voltage division effected from electrical connection between a third MIS transistor of the first conductivity type and a fourth MIS transistor of the second conductivity type, each of the third MIS transistor and the second MIS transistor being in an ON state, a back gate of the third MIS transistor being applied with a source voltage of the third MIS transistor and a back gate of the fourth MIS transistor being applied with a source voltage of the fourth MIS transistor,
wherein another input of the differential amplifier is for receiving another voltage based on voltage division effected from electrical connection between a fifth MIS transistor of the first conductivity type and a sixth MIS transistor of the second conductivity type, each of the fifth MIS transistor and the sixth MIS transistor being in an ON state, a back gate of the fifth MIS transistor being applied with the first well bias voltage and a back gate of the sixth MIS transistor being applied with the second well bias voltage, and
wherein the second well bias voltage is controlled by an output of the differential amplifier.

4. The semiconductor integrated circuit device according to claim 3,
wherein gate lengths of the third MIS transistor and the fourth MIS transistor are equal to each other and a ratio in gate width therebetween is set to be 1:m, and
wherein gate lengths of the fifth MIS transistor and the sixth MIS transistor am equal to each other and a ratio in gate width therebetween is set to be 1:m.

5. The semiconductor integrated circuit device according to claim 3, further comprising:
an oscillator Including a seventh MIS transistor of the first conductivity type and an eighth MIS transistor of the second conductivity type, to output an oscillation signal having a variable frequency,
wherein the first well bias voltage is generated by comparing a frequency of the oscillation signal and a frequency of a reference clock signal.

6. The semiconductor integrated circuit device according to claim 5,
wherein the first well bias voltage is applied to the first MIS transistor via a first buffer circuit; and
wherein the second well bias voltage is applied to the second MIS transistor via a second buffer circuit.

7. The semiconductor integrated circuit device according to claim 6,
wherein the first well bias voltage is applied, via direct coupling, to the seventh MIS transistor, and
wherein the second well bias voltage is applied, via direct coupling, to the eighth MIS transistor.

8. The semiconductor integrated circuit device according to claim 5,
wherein the first well bias voltage is applied to the seventh MIS transistor without connection through a buffer circuit, and
wherein the second well bias voltage is applied to the eighth MIS transistor without connection through a buffer circuit.

9. A semiconductor integrated circuit device, comprising:
a circuit block including a first MIS transistor of a first conductivity type and a second MIS transistor of a second conductivity type; and
a well bias voltage controller to generate a first well bias voltage for the first MIS transistor and a second well bias voltage for the second MIS transistor;
wherein the well bias voltage controller includes a differential amplifier,
wherein one input of the differential amplifier is for receiving a voltage based on voltage division effected from electrical connection between a third MIS transistor of the first conductivity type and a fourth MIS transistor of the second conductivity type, each of the third MIS transistor and the second MIS transistor being in an ON state, a back gate of the third MIS transistor being applied with a source voltage of the third MIS transistor and a back gate of the fourth MIS transistor being applied with a source voltage of the fourth MIS transistor, wherein another input of the differential amplifier is for receiving a voltage based on voltage division effected from electrical connection between a fifth MIS transistor of the first conductivity type and a sixth MIS transistor of the second conductivity type, each of the fifth MIS transistor and the sixth MIS transistor being in an ON state, a back gate of the fifth MIS transistor being applied with the first well bias voltage and a back gate of the sixth MIS transistor being applied with the second well bias voltage, and wherein the second well bias voltage is controlled by an output of the differential amplifier.

10. The semiconductor integrated circuit device according to claim 9, wherein gate lengths of the third MIS transistor and the fourth MIS transistor are equal to each other and a ratio in gate width therebetween is set to be 1:m, and wherein gate lengths of the fifth MIS transistor and the sixth MIS transistor are equal to each other and a ratio in gate width therebetween is set to be 1:m.

11. The semiconductor integrated circuit device according to claim 9, further comprising:

an oscillator including a seventh MIS transistor of the first conductivity type and an eighth MIS transistor of the second conductivity type, to output an oscillation signal having a variable frequency, wherein the first well bias voltage is generated by comparing a frequency of the oscillation signal and a frequency of a reference clock signal.

12. The semiconductor integrated circuit device according to claim 11, wherein the first well bias voltage is applied to the first MIS transistor via a first buffer circuit, and wherein the second well bias voltage is applied to the second MIS transistor via a second buffer circuit.

13. The semiconductor integrated circuit device according to claim 12, wherein the first well bias voltage is applied, via direct coupling, to the seventh MIS transistor, and wherein the second well bias voltage is applied, via direct coupling, to the eighth MIS transistor.

14. The semiconductor integrated circuit device according to claim 13, wherein gate lengths of the third MIS transistor and the fourth MIS transistor are equal to each other and a ratio in gate width therebetween is set to be 1:m, and wherein gate lengths of the fifth MIS transistor and the sixth MIS transistor are equal to each other and a ratio in gate width therebetween is set to be 1:m.

15. The semiconductor integrated circuit device according to claim 11, wherein the first well bias voltage is applied to the seventh MIS transistor without connection through a buffer circuit, and wherein the second well bias voltage is applied to the eighth MIS transistor without connection through a buffer circuit.

* * * * *

UNITED STATES PATENT AND TRADEMARK OFFICE
Certificate

Patent No. 7,112,999 B2                                          Patented: September 26, 2006

On petition requesting issuance of a certificate for correction of inventorship pursuant to 35 U.S.C. 256, it has been found that the above identified patent, through error and without any deceptive intent, improperly sets forth the inventorship.
   Accordingly, it is hereby certified that the correct inventorship of this patent is: Hiroyuki Mizuno, Kokubunji (JP); Koichiro Ishibashi, Warabi (JP); Masayuki Miyazaki, Kokubunji (JP).

Signed and Sealed this Sixth Day of May 2008.

*REXFORD BARNIE*
*Supervisory Patent Examiner*
Art Unit 2819